(12) United States Patent  
Oashi

(10) Patent No.: US 6,770,930 B2  
(45) Date of Patent: Aug. 3, 2004

(54) SEMICONDUCTOR DEVICE HAVING MIM STRUCTURE CAPACITOR

(75) Inventor: Toshiyuki Oashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 2 days.

(21) Appl. No.: 10/369,636

(22) Filed: Feb. 21, 2003

(65) Prior Publication Data

US 2004/0016946 A1 Jan. 29, 2004

(30) Foreign Application Priority Data

Jul. 25, 2002 (JP) .................................. P2002-216577

(51) Int. Cl.⁷ ...................... H01L 27/108; H01L 29/76; H01L 29/94; H01L 31/119
(52) U.S. Cl. ...................... 257/306; 257/309; 257/308
(58) Field of Search .......................... 257/295–310, 257/532; 438/253–254, 396–398

(56) References Cited

U.S. PATENT DOCUMENTS 6,171,925 B1 * 1/2001 Graettinger et al. ........ 257/306
6,346,454 B1   2/2002 Sung et al.
6,352,902 B1 * 3/2002 Aitken et al. ............... 257/308
6,518,120 B2 * 2/2003 Park .......................... 257/301

FOREIGN PATENT DOCUMENTS

JP    2000-208745    7/2000
JP    2001-36010     2/2001

* cited by examiner

Primary Examiner—Cuong Nguyen
(74) Attorney, Agent, or Firm—Oblon, Spivak, McClelland, Maier & Neustadt, P.C.

(57) ABSTRACT

It is an object to provide a semiconductor device in which a structure of a capacitor is simplified. Any electrical connection of a capacitor (CP10) and source—drain regions (11) and (13) is carried out by a contact plug (101) inserted in the capacitor (CP10) and reaching the source—drain regions (11) and (13). The capacitor (CP10) has a capacitor upper electrode (103) provided to be embedded in an upper main surface of an interlayer insulating film (3) and a capacitor dielectric film (102) provided to cover a side surface and a lower surface of the capacitor upper electrode (103). Moreover, the capacitor dielectric film (102) is also provided to cover a side surface of the contact plug (101) formed to penetrate through the capacitor upper electrode (103), and a portion of the contact plug (101) which is covered with the capacitor dielectric film (102) functions as the capacitor lower electrode (101).

8 Claims, 31 Drawing Sheets

SEMICONDUCTOR DEVICE HAVING MIM STRUCTURE CAPACITOR

BACKGROUND OF THE INVENTION

1. Field of the Invention

The present invention relates to a semiconductor device having a capacitor, and more particularly to a semiconductor device comprising a capacitor having an MIM (Metal Insulator Metal) structure to be used in a memory cell section.

2. Description of the Background Art

In a semiconductor device, particularly, a dynamic RAM (DRAM), the number of manufacturing steps tends to be increased and a manufacturing time tends to be prolonged with an enhancement in integration and an increase in a capacity. As a solution, the simplification of the manufacturing steps is the most important element.

FIG. 32 is a partial sectional view showing a memory cell region MR and a peripheral circuit region LR such as a logic circuit, a sense amplifier or a decoder which is provided around the memory cell region MR in a conventional DRAM 90.

As shown in FIG. 32, an element isolating film 2 is selectively provided in a main surface of a silicon substrate 1 and the memory cell region MR and the peripheral circuit region LR are defined, and furthermore, an active region AR is defined in each of the memory cell region MR and the peripheral circuit region LR.

In the active region AR of the memory cell region MR, source—drain regions 11, 12 and 13 are selectively provided in the surface of the substrate and a gate insulating film 21 is selectively provided between upper parts of edges of the source—drain regions 11 and 12 and between upper parts of edges of the source—drain regions 12 and 13, and a gate electrode 22 is provided on the gate insulating film 21.

Moreover, a side wall insulating film 23 is provided to cover a side surface of the gate electrode 22 so that an MOS transistor is constituted.

The gate insulating film 21, the gate electrode 22 and the side wall insulating film 23 are also provided on the element isolating film 2 and function as a word line (a transfer gate).

In the active region AR of the peripheral circuit region LR, furthermore, source—drain regions 14 and 15 are selectively provided in the surface of the substrate and a gate insulating film 31 is provided between upper parts of edges of the source—drain regions 14 and 15. A gate electrode 32 is provided on the gate insulating film 31 and a side wall insulating film 33 is provided to cover a side surface of the gate electrode 32 so that an MOS transistor is constituted.

Then, an interlayer insulating film 3 such as a silicon oxide film is provided to cover the memory cell region MR and the peripheral circuit region LR.

In the memory cell region MR, a bit line 42 is selectively formed in the interlayer insulating film 3 provided on the source—drain region 12 and the bit line 42 is electrically connected to the source—drain region 12 through a contact plug 41.

In the memory cell region MR, thereafter, a cylindrical lower electrode 52 constituting a cylindrical capacitor is selectively formed on the interlayer insulating film 3 corresponding to upper parts of regions in which the source—drain regions 11 and 13 are to be provided. Subsequently, the lower electrode 52 and the source—drain regions 11 and 13 are electrically connected through a contact plug 51 provided to penetrate through the interlayer insulating film 3, respectively.

Moreover, a capacitor dielectric film 53 constituted by a dielectric such as $Ta_2O_5$ is provided from a surface of the lower electrode 52 between the lower electrodes 52 over the interlayer insulating film 3 formed therearound, and a capacitor upper electrode 54 is provided along a surface of the capacitor dielectric film 53 so that a cylindrical capacitor CP1 is constituted.

An interlayer insulating film 4 is provided over a whole surface to cover the cylindrical capacitor CP1. Flattening is carried out such that main surfaces of the interlayer insulating films 4 are on the level with each other in the memory cell region MR and the peripheral circuit region LR, and an interlayer insulating film 5 is provided on the interlayer insulating film 4.

A wiring layer 72 to be a first wiring layer which is electrically connected to the capacitor upper electrode 54 is selectively provided in a lower main surface of the interlayer insulating film 5 in the memory cell region MR, and a wiring layer 74 is provided in an upper main surface of the interlayer insulating film 5 which is provided above the wiring layer 72 and is electrically connected to the wiring layer 72 through a contact plug 73. The wiring layer 72 and the capacitor upper electrode 54 are electrically connected through a contact plug 71 provided in the interlayer insulating film 4.

Moreover, a wiring layer 62 to be a first wiring layer is selectively provided in the lower main surface of the interlayer insulating film 5 in the peripheral circuit region LR. The wiring layers 62 are formed in regions corresponding to portions provided above the source—drain regions 14 and 15, and penetrate through the interlayer insulating films 3 and 4 and are electrically connected to the source—drain regions 14 and 15 through a contact plug 61 reaching the source—drain regions 14 and 15.

Furthermore, a wiring layer 64 to be a second wiring layer is selectively provided in the upper main surface of the interlayer insulating film 5, and is electrically connected to one of the wiring layers 62 through a contact plug 63. A contact plug 65 penetrating through the interlayer insulating film 5 is connected to the other wiring layer 62.

The wiring layers 62, 64, 72 and 74 and the contact plugs 63, 65 and 73 are constituted by copper (Cu), for example, and the contact plugs 51, 61 and 71 are constituted by tungsten (W), for example.

While an interlayer insulating film and a wiring layer are further formed on the interlayer insulating film 5 in some cases, their illustration and description will be omitted.

As described above, the conventional DRAM 90 comprises the cylindrical capacitor CP1 as a capacitor having an MIM structure. In the formation of the capacitor CP1, the contact plug 51 to be an electrode plug is provided in the interlayer insulating film 3, the capacitor lower electrode 52, the capacitor dielectric film 53 and the capacitor upper electrode 54 are sequentially provided, and furthermore, the contact plug 71 for the connection of the capacitor upper electrode 54 to the wiring layer 72 is formed. Thus, a complicated manufacturing process is required.

SUMMARY OF THE INVENTION

It is an object of the present invention to provide a semiconductor device in which a structure of a capacitor is simplified and a manufacturing process is reduced, and a method of manufacturing the semiconductor device.

According to the present invention, a semiconductor device having a multilayer structure includes a capacitor provided in an upper main surface of a first region of an interlayer insulating film, and a wiring layer provided in an upper main surface of a second region of the interlayer insulating film. The capacitor has a capacitor upper electrode provided to be embedded in the upper main surface of the first region of the interlayer insulating film, a capacitor dielectric film provided to cover at least a side surface and a lower surface of the capacitor upper electrode, and at least one lower electrode-and-plug electrically connecting the capacitor to a structure of a layer provided under the capacitor and having a portion inserted in a vertical direction of the capacitor upper electrode, the inserted portion functioning as a capacitor lower electrode, the capacitor dielectric film also covers a surface of the inserted portion of the at least one lower electrode-and-plug, and the wiring layer is electrically connected to a structure of a layer provided under the wiring layer by at least one contact plug having a portion inserted in a vertical direction of the wiring layer.

The capacitor lower electrode also uses as a capacitor contact to be electrically connected to the structure of the lower layer. In the first region, the lower electrode and the capacitor contact can be formed at the same time. Moreover, at least one contact plug to be a contact of the wiring layer in the second region with the structure of the lower layer thereof is also formed at the same time. Consequently, a manufacturing process can be simplified so that a manufacturing cost can be reduced. Furthermore, the capacitor is embedded in the upper main surface of the interlayer insulating film and the capacitor upper electrode can be provided simultaneously with the formation of the wiring layer in the second region by the Single Damascene method. Thus, the manufacturing process can be simplified.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Embodiment

A-1. Structure of Device

For a semiconductor device according to a first embodiment of the present invention, a structure of a DRAM 100 will be described with reference to FIG. 1.

Figure 1:
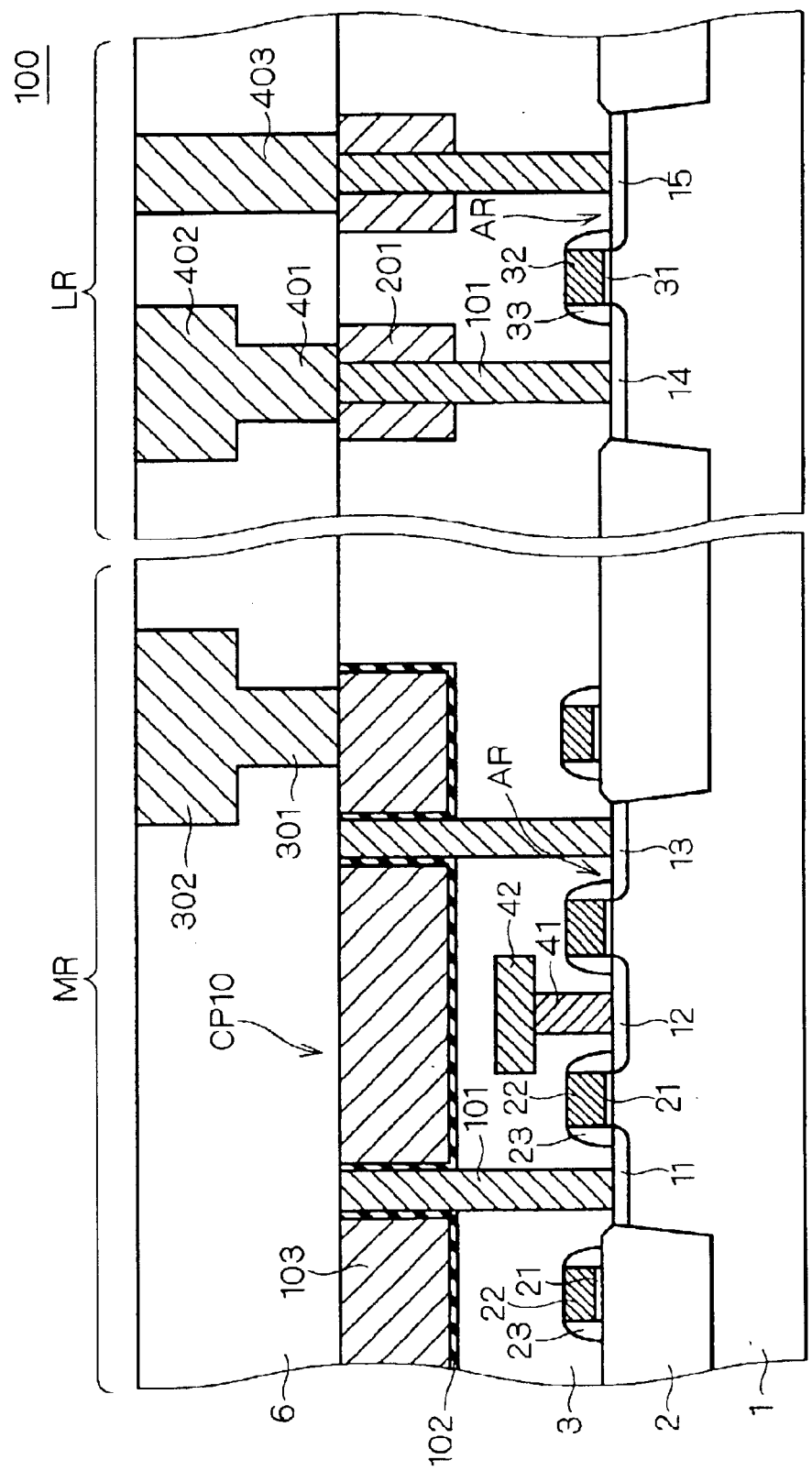
FIG. 1 is a sectional view illustrating a structure of a semiconductor device according to a first embodiment of the present invention.

FIG. 1 is a partial sectional view showing a memory cell region MR and a peripheral circuit region LR such as a logic circuit, a sense amplifier or a decoder which is provided around the memory cell region MR in the DRAM 100. FIG. 1 shows only a structure of a part of the DRAM 100 and the number of elements or the like is not restricted thereto.

As shown in FIG. 1, an element isolating film 2 is selectively provided in a main surface of a silicon substrate 1 and the memory cell region MR and the peripheral circuit region LR are defined, and furthermore, an active region AR is defined in each of the memory cell region MR and the peripheral circuit region LR.

In the active region AR of the memory cell region MR, source—drain regions 11, 12 and 13 are selectively provided in the surface of the substrate and a gate insulating film 21 is selectively provided between upper parts of edges of the source—drain regions 11 and 12 and between upper parts of edges of the source—drain regions 12 and 13, and a gate electrode 22 is provided on the gate insulating film 21.

Moreover, a side wall insulating film 23 is provided to cover a side surface of the gate electrode 22 so that an MOS transistor is constituted.

The gate insulating film 21, the gate electrode 22 and the side wall insulating film 23 are also provided on the element isolating film 2 and function as a word line (a transfer gate).

In the active region AR of the peripheral circuit region LR, furthermore, source—drain regions 14 and 15 are selectively provided in the surface of the substrate and a gate insulating film 31 is provided between upper parts of edges of the source—drain regions 14 and 15. A gate electrode 32 is provided on the gate insulating film 31 and a side wall insulating film 33 is provided to cover a side surface of the gate electrode 32 so that an MOS transistor is constituted.

Then, an interlayer insulating film 3 such as a silicon oxide film is provided to cover the memory cell region MR and the peripheral circuit region LR.

In the memory cell region MR, a bit line 42 is selectively formed in the interlayer insulating film 3 provided on the source—drain region 12 and the bit line 42 is electrically connected to the source—drain region 12 through a contact plug 41.

In the memory cell region MR, a capacitor CP10 is provided in an upper main surface of the interlayer insulating film 3, any electrical connection of the capacitor CP10 and the source—drain regions 11 and 13 is carried out by a contact plug 101 inserted in the capacitor CP10 and reaching the source—drain regions 11 and 13. The contact plug 101 is inserted to penetrate through a capacitor upper electrode 103 in a vertical direction.

The capacitor CP10 has the capacitor upper electrode 103 provided to be embedded in the upper main surface of the interlayer insulating film 3 and a capacitor dielectric film 102 provided to cover a side surface and a lower surface of the capacitor upper electrode 103. Moreover, the capacitor dielectric film 102 is also provided to cover a side surface of the contact plug 101 formed to penetrate through the capacitor upper electrode 103 in a vertical direction thereof, and a portion of the contact plug 101 which is covered with the capacitor dielectric film 102 functions as a capacitor lower electrode 101. Accordingly, it is apparent that the contact plug 101 is a lower electrode-and-plug to be also used for the capacitor lower electrode in the memory cell region MR. The contact plug 101 takes the shape of a cylinder or a prism and is constituted by tungsten (W), for example.

In the peripheral circuit region LR, moreover, a wiring layer 201 to be a first wiring layer is selectively provided in the upper main surface of the interlayer insulating film 3. The wiring layer 201 is provided in each of regions corresponding to portions provided above the source—drain regions 14 and 15, and both the source—drain regions 14 and 15 are electrically connected by a contact plug 101 penetrating through the wiring layer 201 in a vertical direction and penetrating through the interlayer insulating film 3 to reach the source—drain regions 14 and 15.

Then, an interlayer insulating film 6 is provided on the interlayer insulating film 3, and a wiring layer 302 to be a second wiring layer is selectively provided in an upper main surface of the interlayer insulating film 6 in the memory cell region MR and is electrically connected to the capacitor upper electrode 103 through a contact plug 301.

Moreover, a wiring layer 402 to be a second wiring layer is selectively provided in the upper main surface of the interlayer insulating film 6 in the peripheral circuit region LR, and is electrically connected to one of the wiring layers 201 through a contact plug 401. A contact plug 403 penetrating through the interlayer insulating film 6 is connected to the other wiring layer 201.

The capacitor upper electrode 103, the wiring layers 201, 302 and 402 and the contact plugs 301, 401 and 403 are constituted by copper (Cu), for example.

While an interlayer insulating film and a wiring layer are further formed on the interlayer insulating film 6 in some cases, their illustration and description will be omitted.

A-2. Manufacturing Method

A method of manufacturing the DRAM 100 will be described below with reference to FIGS. 2 to 14 which are sectional views sequentially showing a manufacturing process.

FIGS. 2 to 14 are partial sectional views showing a memory cell region MR and a peripheral circuit region LR such as a logic circuit, a sense amplifier or a decoder which is provided around the memory cell region MR in the DRAM 100.

Figure 2:
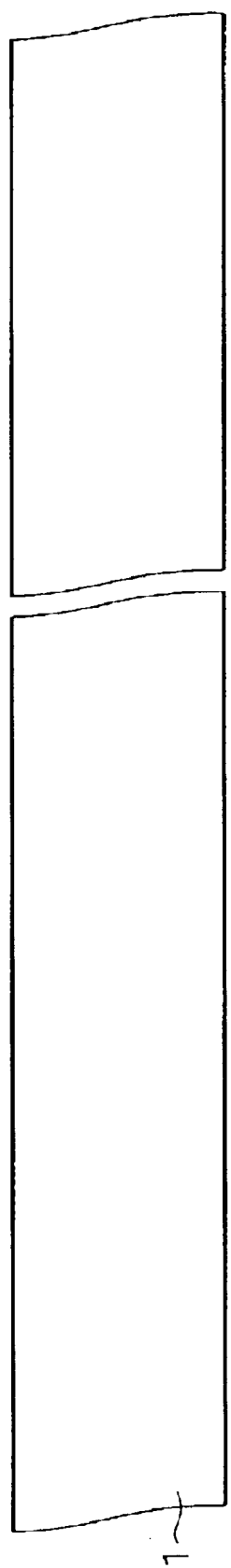
FIGS. 2 to 14 are sectional views illustrating a process for manufacturing the semiconductor device according to the first embodiment of the present invention.
Figure 3:
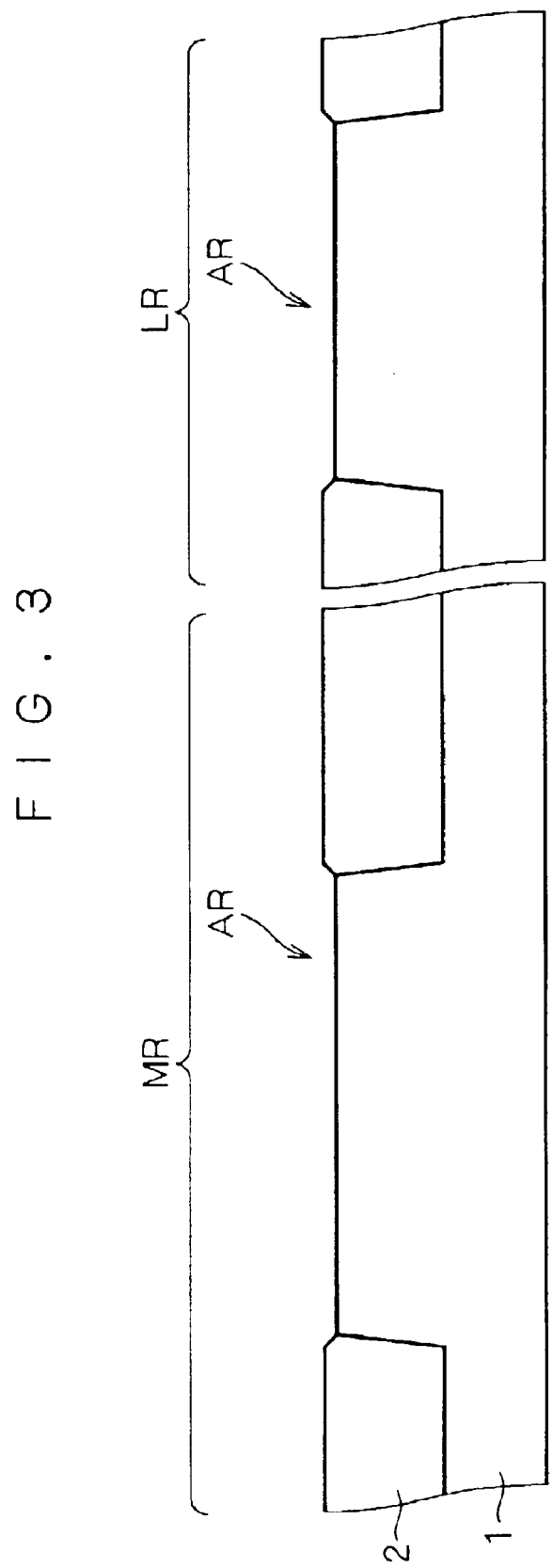

First of all, a silicon substrate 1 is prepared as shown in FIG. 2, and an element isolating film 2 is selectively formed in a main surface of the silicon substrate 1 to define a memory cell region MR and a peripheral circuit region LR and to define an active region AR in each of the memory cell region MR and the peripheral circuit region LR at a step shown in FIG. 3.

Figure 4:
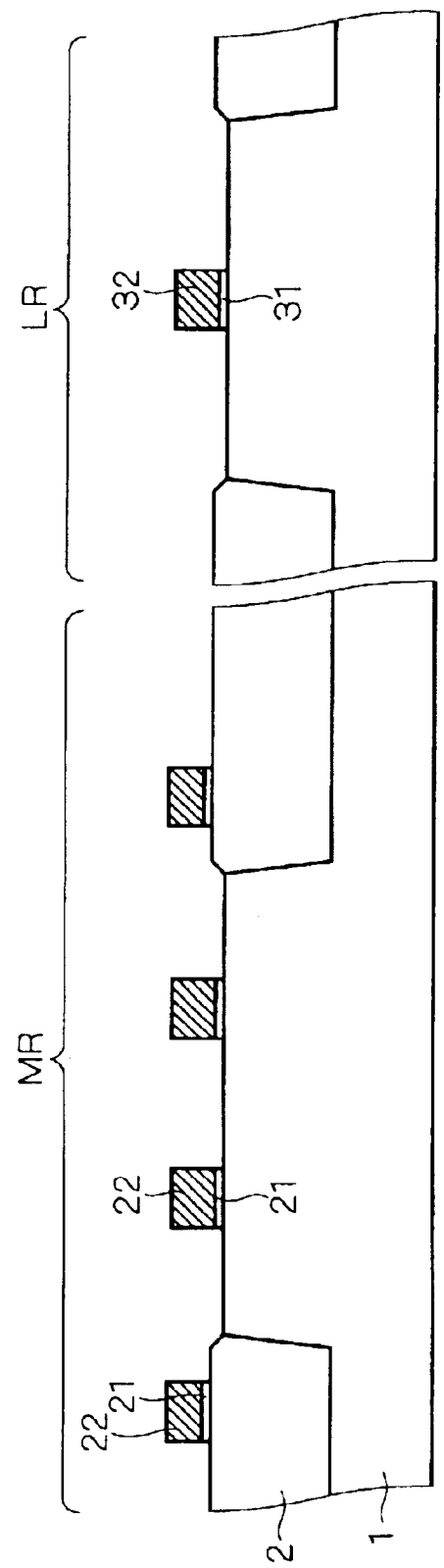

Next, a lamination structure of a gate insulating film 21 and a gate electrode 22 is selectively formed in the active region AR of the memory cell region MR and a lamination structure of a gate insulating film 31 and a gate electrode 32 is selectively formed in the peripheral circuit region LR by a conventional method at a step shown in FIG. 4. The gate insulating films 21 and 31 are constituted by a silicon oxide film and have thicknesses set to be approximately 2 nm, for example, and the gate electrodes 22 and 32 are constituted by a polysilicon film and have thicknesses set to be approximately 200 nm.

In the memory cell region MR, the lamination structure of the gate insulating film 21 and the gate electrode 22 is also formed on the element isolating film 2.

Figure 5:
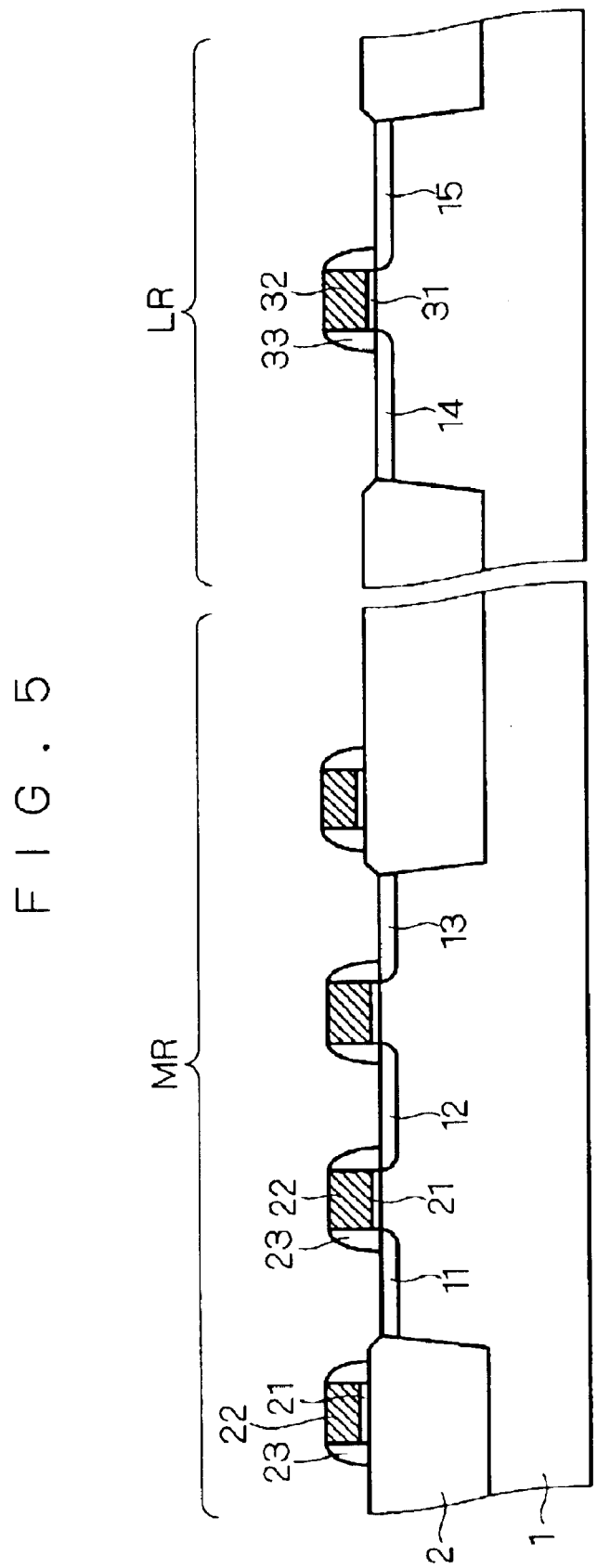

At a step shown in FIG. 5, next, an impurity ion is implanted by using the gate electrode 22 as an implantation mask in the memory cell region MR so that source—drain regions 11, 12 and 13 are formed in the main surface of the silicon substrate 1. In the peripheral circuit region LR, moreover, an impurity ion is implanted by using the gate electrode 32 as an implantation mask so that source—drain regions 14 and 15 are formed in the main surface of the silicon substrate 1.

Then, a side wall insulating film 23 is formed to cover a side surface of the gate electrode 22, and furthermore, a side wall insulating film 33 is formed to cover a side surface of the gate electrode 32 so that an MOS transistor is obtained.

Figure 6:
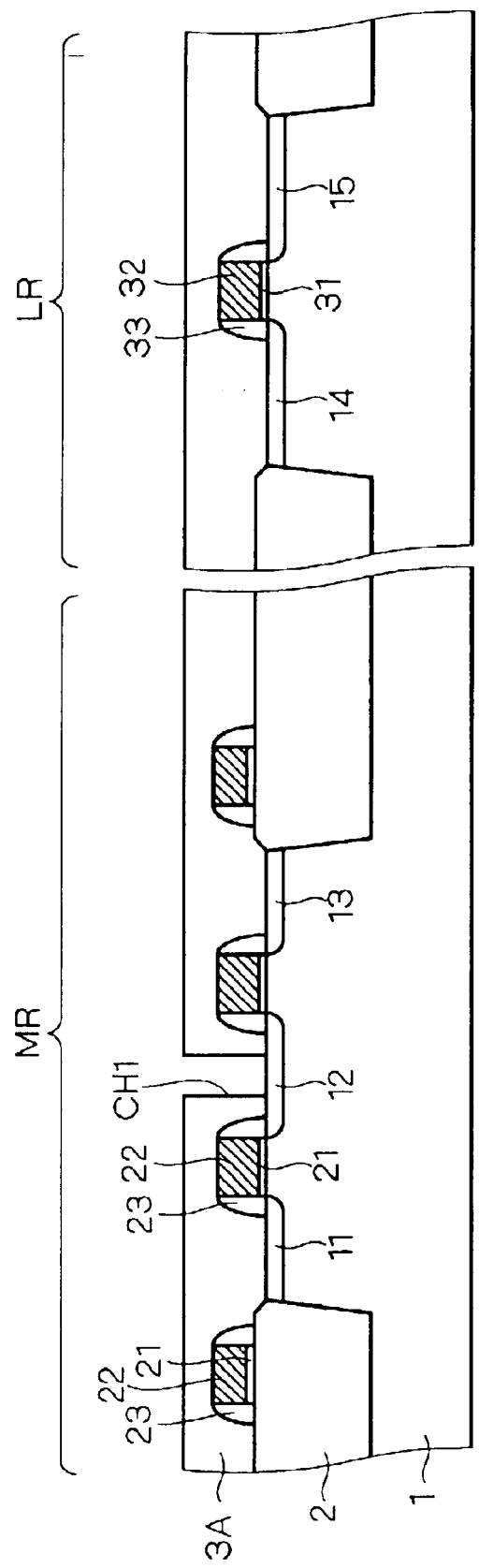

At a step shown in FIG. 6, next, an interlayer insulating film 3A having a thickness of approximately 400 nm is formed of a silicon oxide film over a whole surface of the silicon substrate 1, thereby covering the MOS transistor, for example. In the memory cell region MR, thereafter, a contact hole CH1 reaching the source—drain region 12 is formed to penetrate through the interlayer insulating film 3A.

Figure 7:
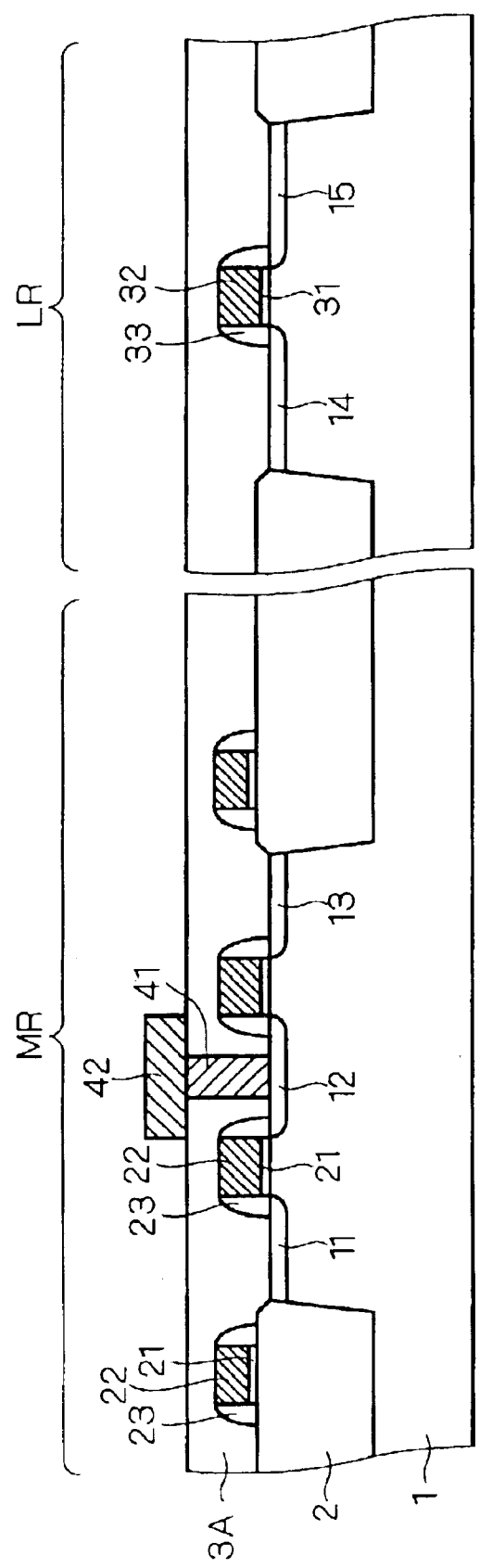

At a step shown in FIG. 7, subsequently, a conductor film constituted by tungsten and having a thickness of approximately 100 nm is formed on the interlayer insulating film 3A, for example, and the contact hole CH1 is filled up to form a contact plug 41 and the conductor film is then removed selectively, thereby forming a bit line 42.

Figure 8:
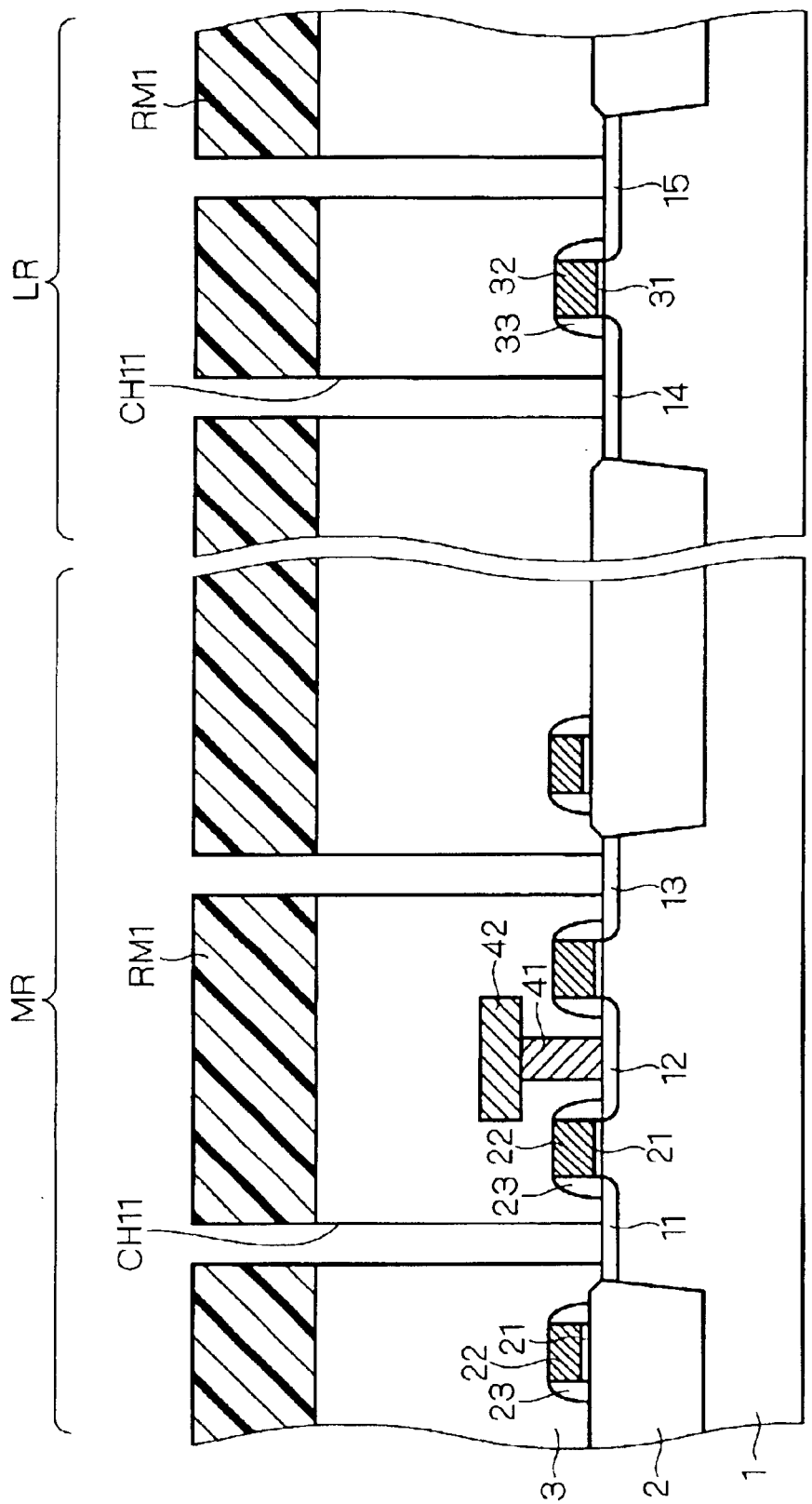
Figure 9:
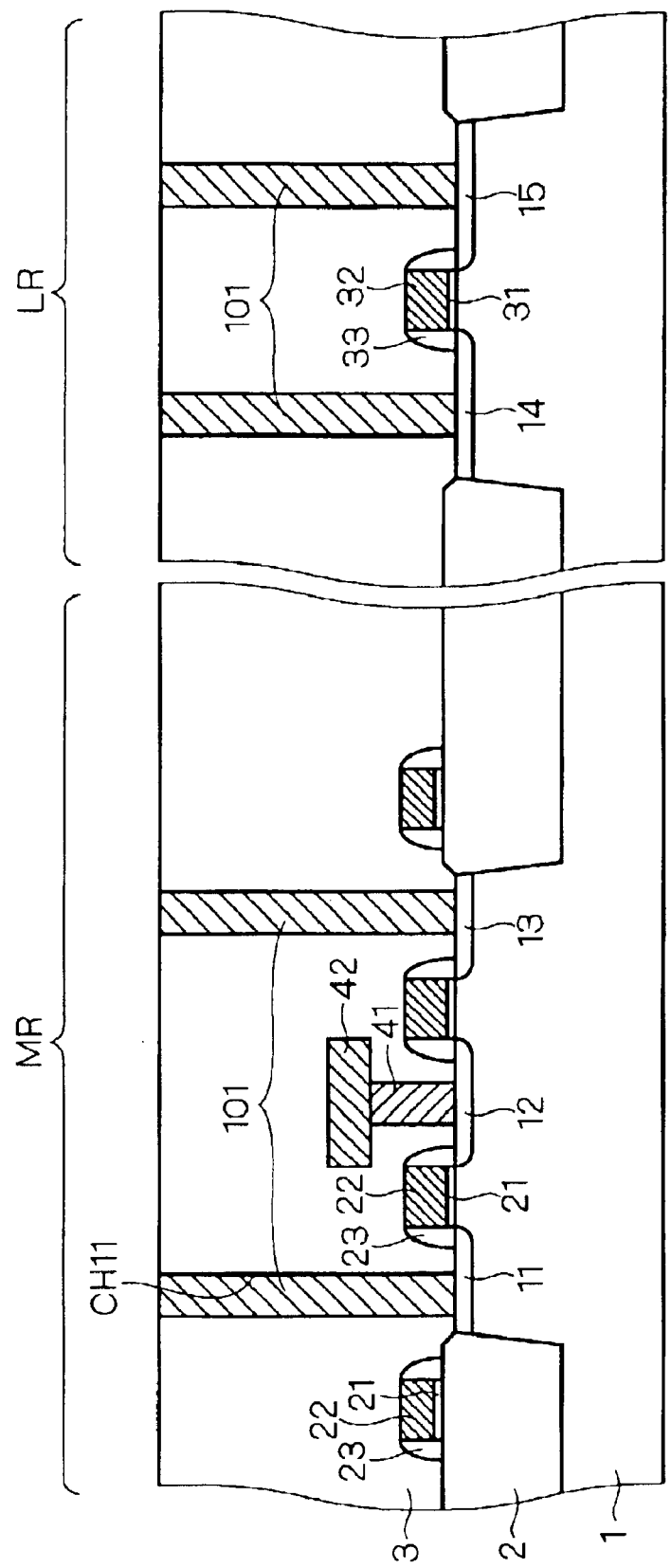

At a step shown in FIG. 8, next, an interlayer insulating film constituted by a silicon oxide film and having a thickness of approximately 600 nm is formed on the interlayer insulating film 3A, for example, so that an interlayer insulating film 3 having a thickness of approximately 1000 nm together with the interlayer insulating film 3A is obtained.

Then, a resist is applied to a whole surface of the interlayer insulating film 3 and a resist pattern for forming a contact plug is transferred to form a resist mask RM1 in the memory cell region MR and the peripheral circuit region LR by photolithography.

By using the resist mask RM1 to carry out anisotropic dry etching, then, a contact hole CH11 penetrating through the interlayer insulating film 3 is formed. The contact hole CH11 takes the shape of a cylinder or a prism.

The contact hole CH11 in the memory cell region MR is provided in positions reaching the source—drain regions 11 and 13, and the contact hole CH11 in the peripheral circuit region LR is provided in positions reaching the source—drain regions 14 and 15.

Next, the resist mask RM1 is removed. At a step shown in FIG. 9, then, a conductor film constituted by tungsten and having a thickness of approximately 100 nm, for example, is formed over the whole surface of the interlayer insulating film 3 and is embedded in each contact hole CH11. Thereafter, the conductor film formed on the interlayer insulating film 3 is removed by CMP (Chemical Mechanical Polishing) to form a contact plug 101 in the contact hole CH11.

Figure 10:
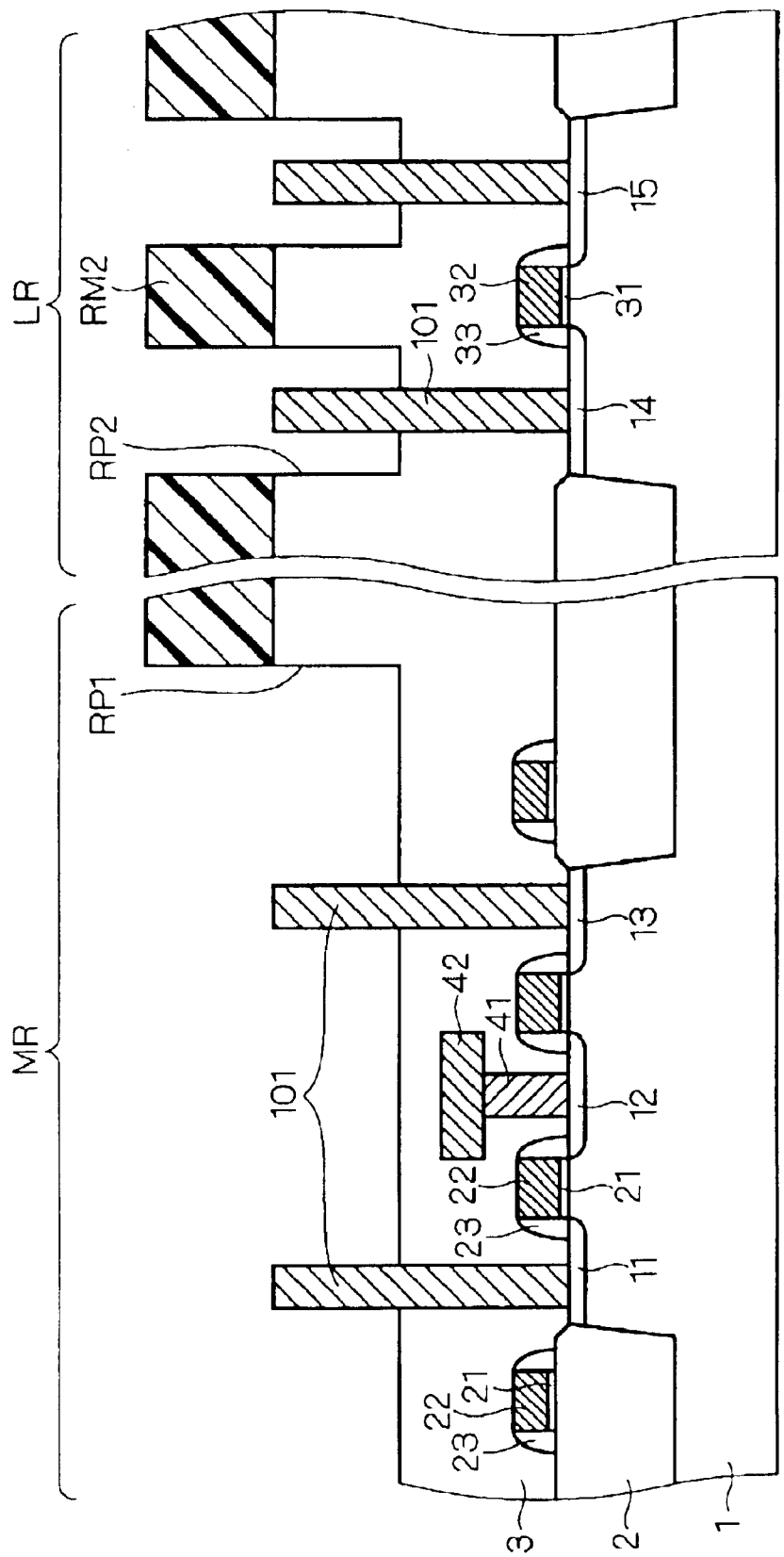

At a step shown in FIG. 10, subsequently, a resist is applied to the whole surface of the interlayer insulating film 3 and a resist pattern for forming a capacitor and a first wiring layer is transferred by the photolithography, thereby forming a resist mask RM2.

In the resist pattern for forming a capacitor, a wide region including a plurality of memory cells in which a capacitor upper electrode 103 is to be formed later is an opening. In the resist pattern for forming a first wiring layer, a region in which the first wiring layer is to be formed later is an opening.

Next, the anisotropic dry etching is carried out by using the resist mask RM2 to selectively remove the interlayer insulating film 3. Consequently, a recess section RP1 for forming a capacitor and a recess section RP2 for forming a first wiring layer are provided in the memory cell region MR and the peripheral circuit region LR at the same time, respectively. The recess sections RP1 and RP2 have depths of approximately 300 nm, and the contact plug 101 is protruded from bottom portions thereof.

Then, the resist mask RM2 is removed. At a step shown in FIG. 11, thereafter, a dielectric film constituted by $Ta_2O_5$ and having a thickness of approximately 10 nm, for example, is formed over the whole surfaces of the memory cell region MR and the peripheral circuit region LR. In the memory cell region MR, subsequently, a resist mask RM3 is patterned to cover the dielectric film. The dielectric film in the peripheral circuit region LR is removed by etching, thereby forming a capacitor dielectric film 102 in only the memory cell region MR. The capacitor dielectric film 102 is formed along an internal surface of the recess section RP1, and furthermore, is provided to cover a side surface and an end surface of the contact plug 101 protruded from a bottom surface of the recess section RP1.

Next, the resist mask RM3 is removed. At a step shown FIG. 12, then, a conductor film constituted by copper and having a thickness of approximately 300 nm, for example, is formed over the whole surfaces of the memory cell region MR and the peripheral circuit region LR, and the conductor film is embedded in the recess sections RP1 and RP2.

Thereafter, flattening is carried out by removing the conductor film formed on the interlayer insulating film 3 and the conductor film rising onto the recess sections RP1 and RP2 by the CMP. In this case, in the memory cell region MR, the capacitor dielectric film 102 provided on the end surface of the contact plug 101 and the capacitor dielectric film 102 provided on the interlayer insulating film 3 are removed together.

Figure 11:
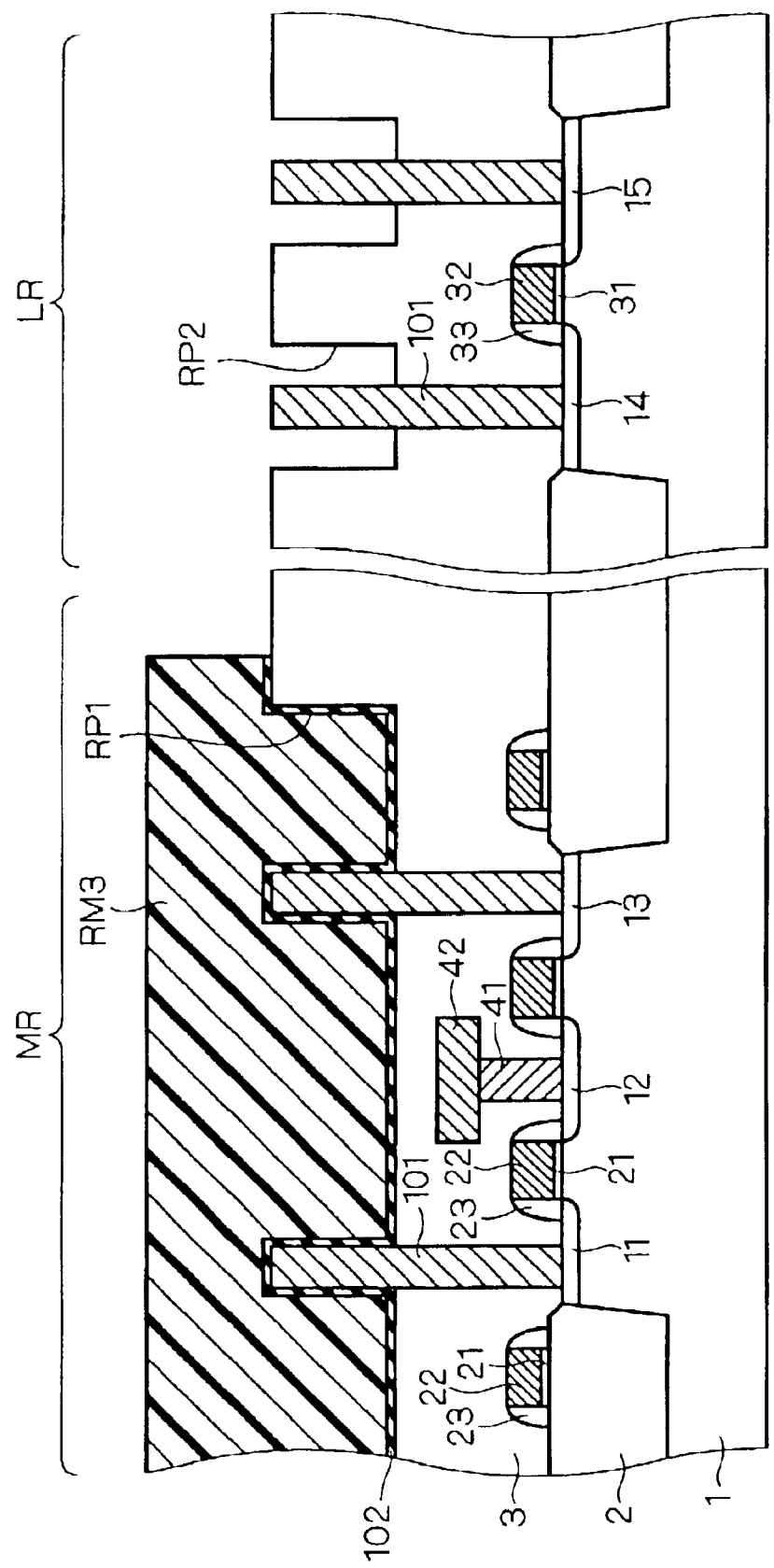
Figure 12:
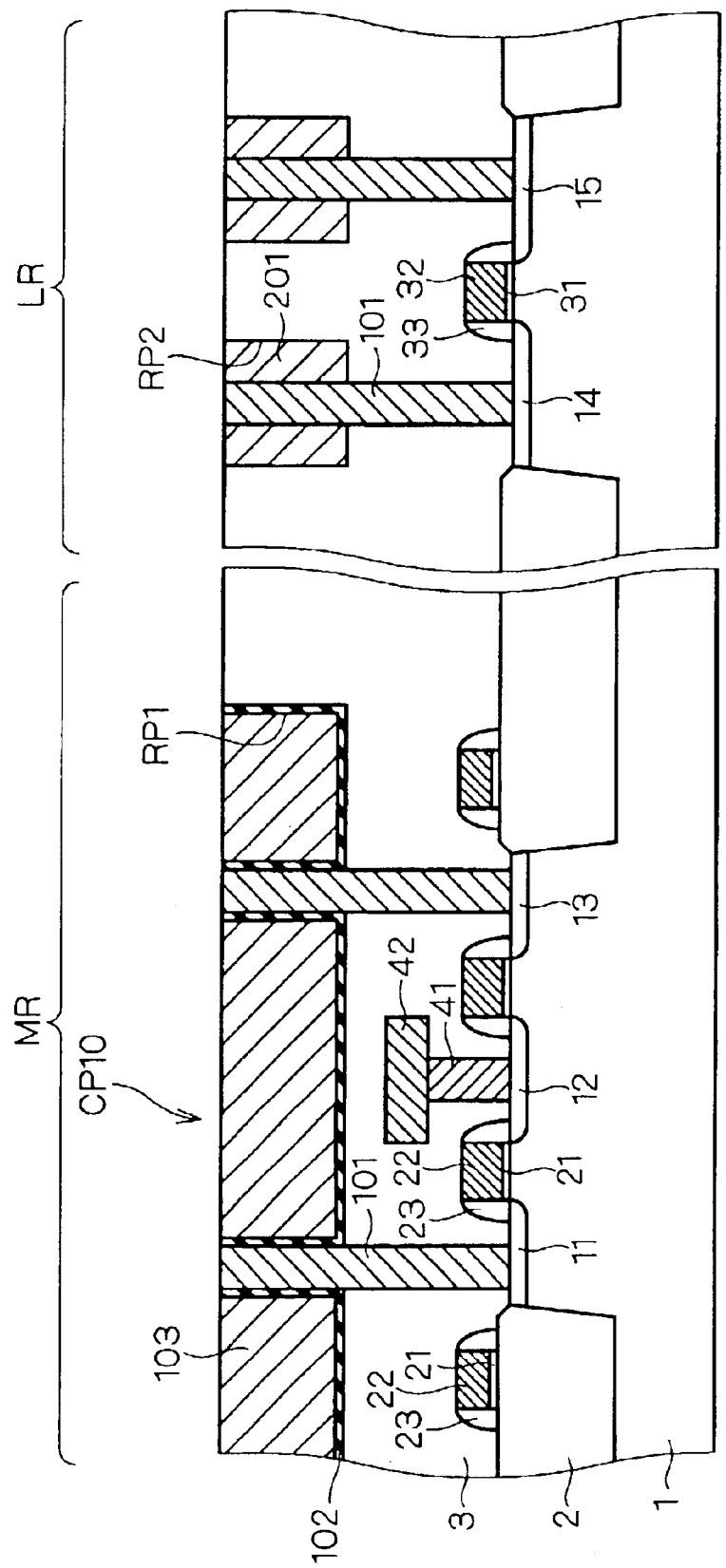

As a result, a capacitor CP10 is obtained by the capacitor upper electrode 103 and the capacitor dielectric film 102 which are embedded in the upper main surface of the interlayer insulating film 3 and the contact plug 101 provided to penetrate through the capacitor upper electrode 103 in a vertical direction thereof and serving as the capacitor lower electrode in the memory cell region MR, and the wiring layer 201 embedded in the upper main surface of the interlayer insulating film 3 is obtained in the peripheral circuit region LR. The method of manufacturing the first wiring layer described with reference to FIGS. 10 to 12 is also referred to as the Single Damascene method, and it is apparent that the capacitor upper electrode 103 is formed by the Single Damascene method.

Figure 13:
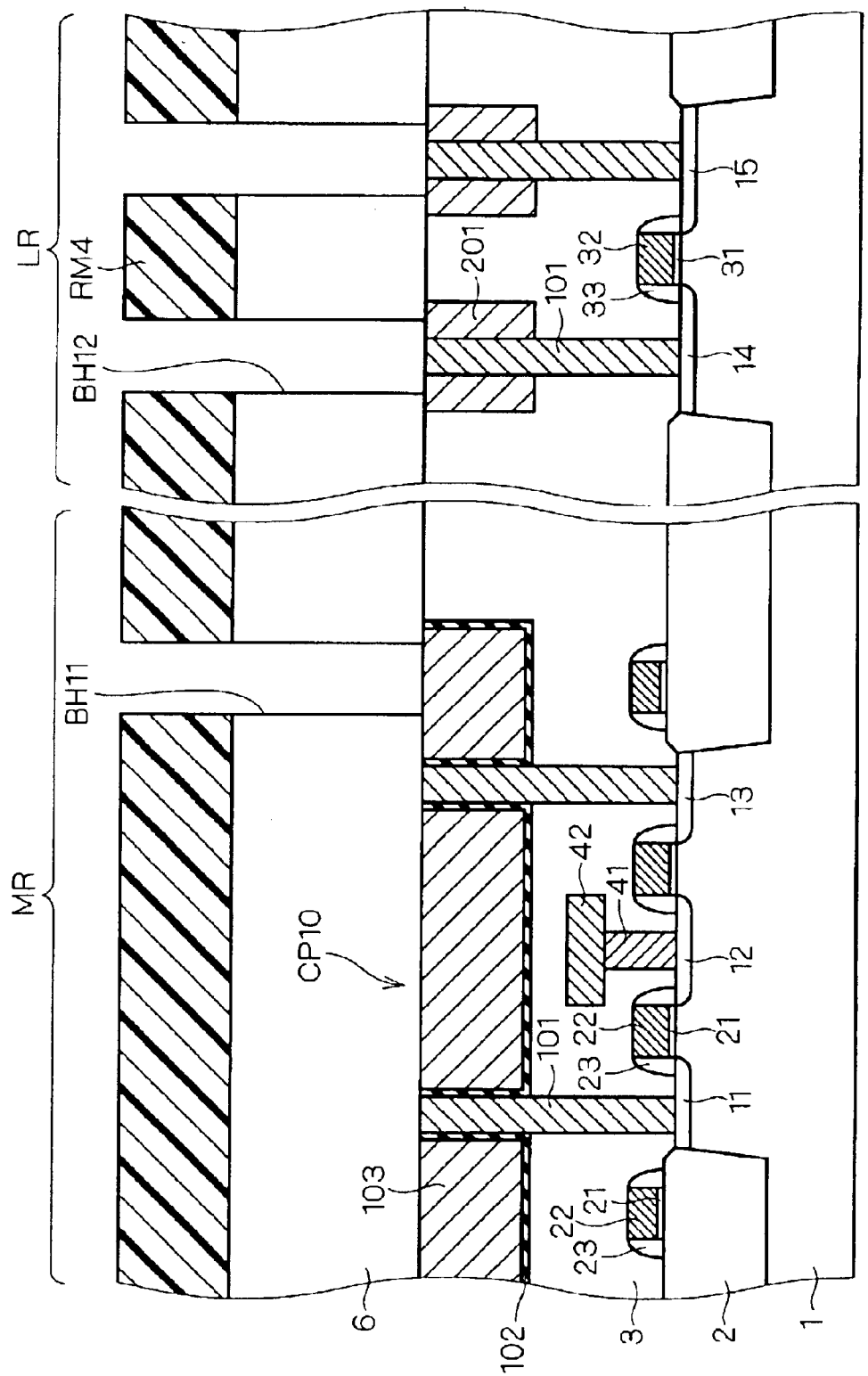

At a step shown in FIG. 13, next, an interlayer insulating film 6 is formed by a silicon oxide film or the like over the whole surfaces of the memory cell region MR and the peripheral circuit region LR.

Then, a resist is applied to a whole surface of the interlayer insulating film 6 and a resist pattern for forming a contact plug is transferred to form a resist mask RM4 in the memory cell region MR and the peripheral circuit region LR by the photolithography.

Thereafter, the anisotropic dry etching is carried out by using the resist mask RM4. Consequently, a via hole BH11 reaching the capacitor upper electrode 103 of the capacitor CP10 is formed in the memory cell region MR and a via hole BH12 reaching the wiring layer 201 is formed in the peripheral circuit region LR.

Next, the resist mask RM4 is removed. At a step shown in FIG. 14, subsequently, a resist is applied to the whole surface of the interlayer insulating film 6 and a resist pattern for forming a second wiring layer is transferred to form a resist mask RM5 in the memory cell region MR and the peripheral circuit region LR by the photolithography.

Then, the anisotropic dry etching is carried out by using the resist mask RM5. Consequently, a recess section RP11 communicating with the via hole BH11 and a recess section RP12 communicating with the via hole BH12 are formed in the memory cell region MR and the peripheral circuit region LR at the same time, respectively. The recess sections RP11 and RP12 have depths of approximately 250 nm. Thereafter, the resist mask RM5 is removed. Subsequently, a conductor film constituted by copper and having a thickness of approximately 300 nm, for example, is formed over the whole surfaces of the memory cell region MR and the peripheral circuit region LR, and the conductor film is simultaneously embedded in the recess sections RP11 and RP12 and the via holes BH11 and BH12. Next, the conductor film provided on the interlayer insulating film 6 is removed by the CMP.

Figure 20:
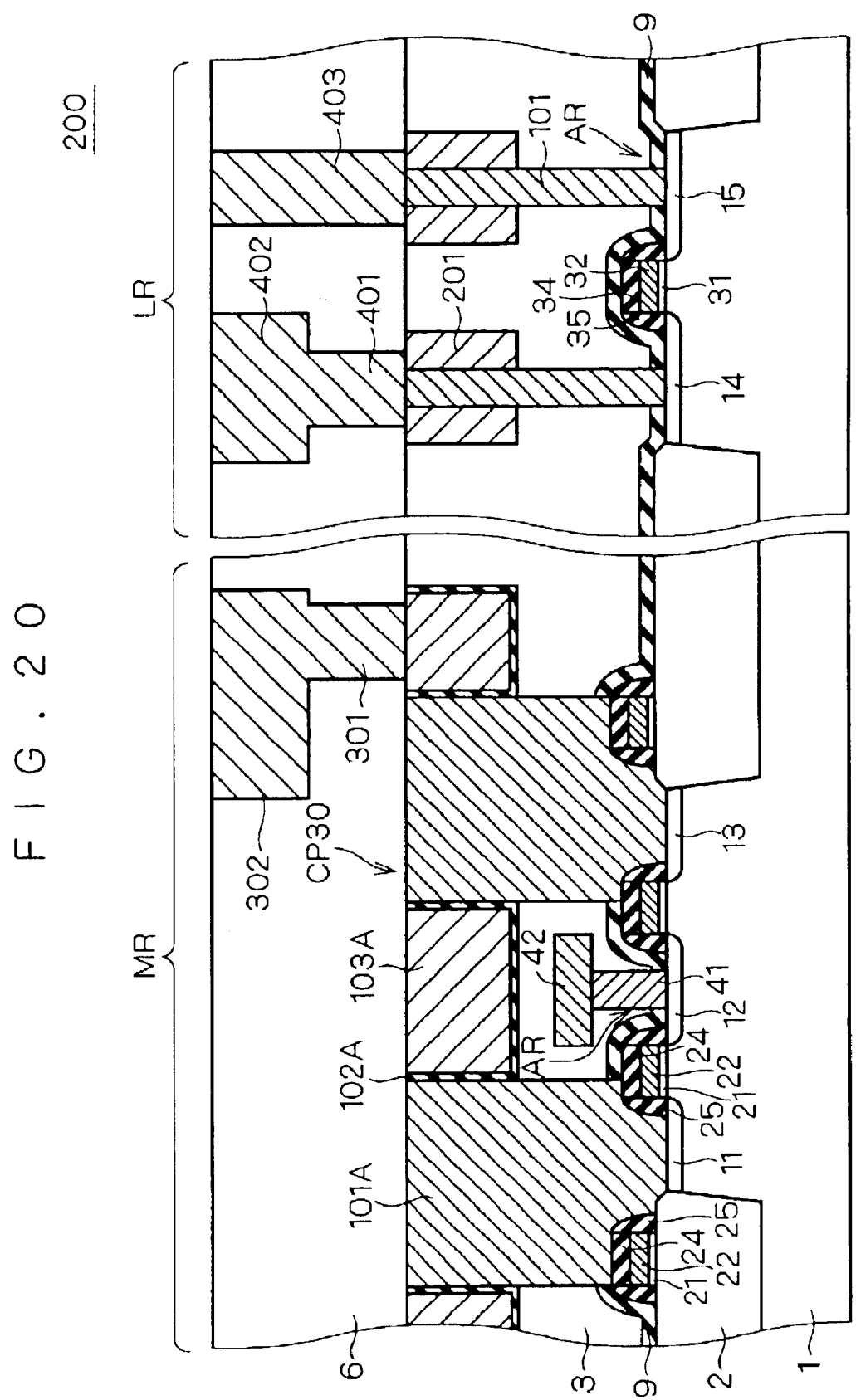
FIG. 20 is a sectional view illustrating a structure of a semiconductor device according to a second embodiment of the present invention.

As a result, as shown in FIG. 20, it is possible to obtain such a structure that a wiring layer 302 to be a second wiring layer is selectively provided in the upper main surface of the interlayer insulating film 6 in the memory cell region MR and is electrically connected to the capacitor upper electrode 103 through a contact plug 301. A wiring layer 402 to be a second wiring layer is selectively provided in the upper main surface of the interlayer insulating film 6 in the peripheral circuit region LR and is electrically connected to one of the wiring layers 201 through a contact plug 401, and a contact plug 403 penetrating through the interlayer insulating film 6 is connected to the other wiring layer 201.

Figure 14:
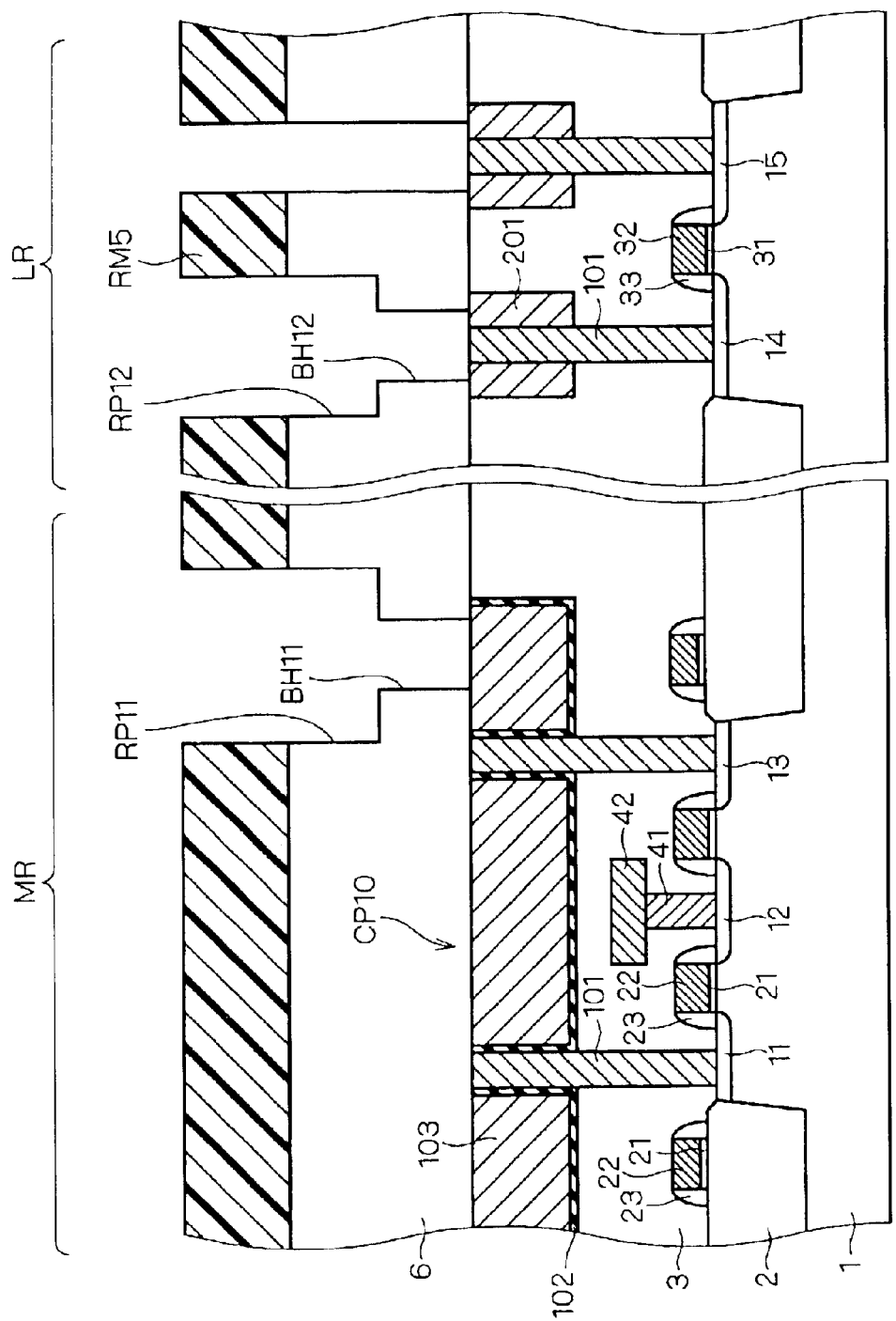

The method of manufacturing the second wiring layer described with reference to FIGS. 13 and 14 will be referred to as the Dual Damascene method.

Figure 15:
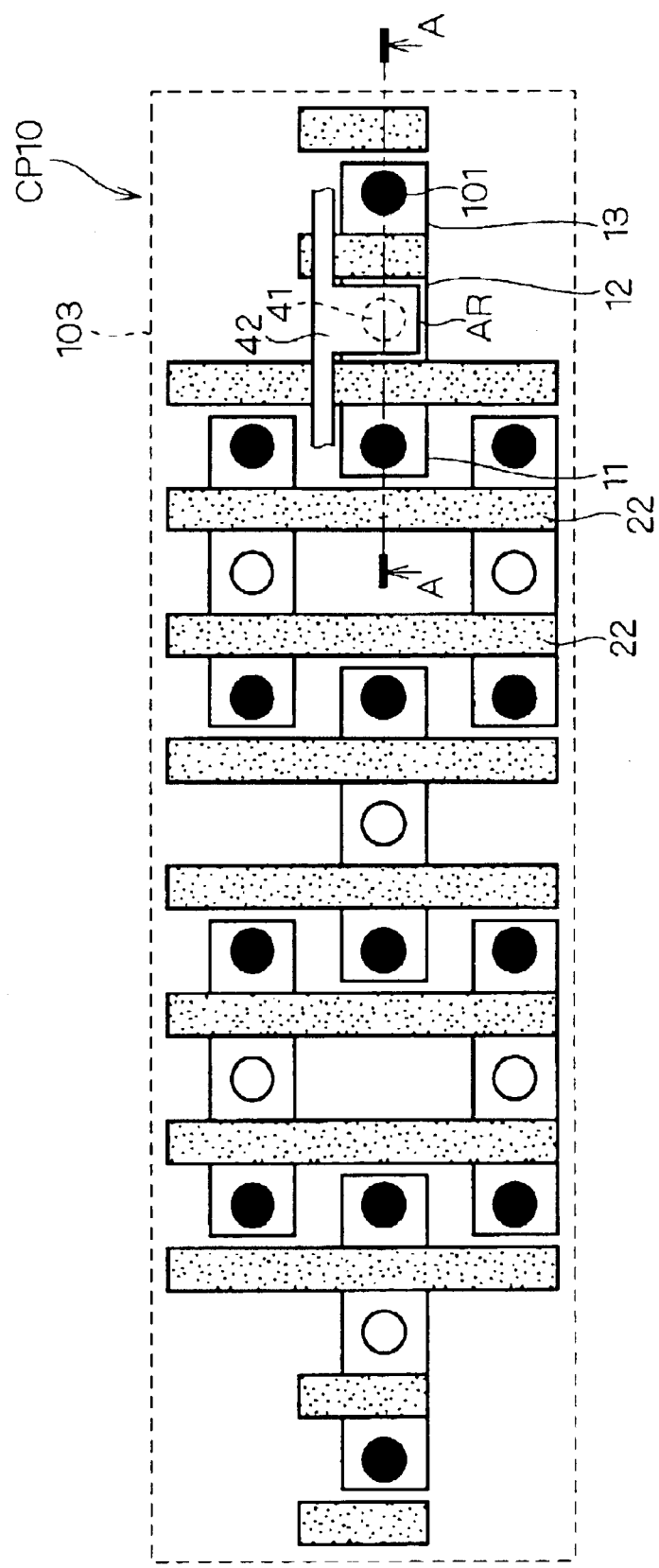
FIG. 15 is a view illustrating a planar structure of the semiconductor device according to the first embodiment of the present invention.

FIG. 15 shows an example of a planar structure of the memory cell region MR in the DRAM 100.

FIG. 15 shows a planar structure of the memory cell region MR seen from the capacitor upper electrode 103 side in the state illustrated in FIG. 12. For convenience, the capacitor upper electrode 103 is shown in a broken line and a structure of a layer provided under the capacitor upper electrode 103 is illustrated clearly. Moreover, only a part of the bit line 42 is shown. The memory cell region MR in FIGS. 2 to 14 corresponds to a sectional view taken along an A—A line. It is apparent that the capacitor upper electrode 103 is provided to cover a wide region including a plurality of memory cells.

FIG. 15 shows a structure in which one contact plug 101 is connected to each of the source—drain regions 11 and 12. In the case in which the source—drain regions 11 and 12 have large areas and a plurality of contact plugs 101 can be connected, the contact plugs 101 may be provided. Consequently, it is possible to increase an electric charge storage capacitance per memory cell.

A-3. Function and Effect

As described above, in the semiconductor device according to the first embodiment of the present invention, the lower electrode of the capacitor CP10 is also used as the contact plug 101 to be a capacitor contact, and the lower electrode and the capacitor contact can be simultaneously formed in the memory cell region MR and the contact plug 101 to be a contact of the first wiring layer in the peripheral circuit region LR with a semiconductor element is also formed simultaneously. Consequently, the manufacturing process can be simplified so that a manufacturing cost can be reduced.

Moreover, the capacitor CP10 is embedded in the upper main surface of the interlayer insulating film 3, and the capacitor upper electrode 103 is also used as the first wiring layer in the memory cell region MR and can be formed by the Single Damascene method simultaneously with the formation of the first wiring layer in the peripheral circuit region LR. Consequently, the manufacturing process can be simplified so that the manufacturing cost can be reduced.

Furthermore, since the contact plug 101 in the memory cell region MR penetrates through the capacitor upper electrode 103, manufacture can easily be carried out.

A-4. Variant

As a variant of the DRAM 100 described above, FIG. 16 shows a structure of a DRAM 100A. The same structures as those of the DRAM 100 shown in FIG. 1 have the same reference numerals and repetitive description will be omitted.

Figure 16:
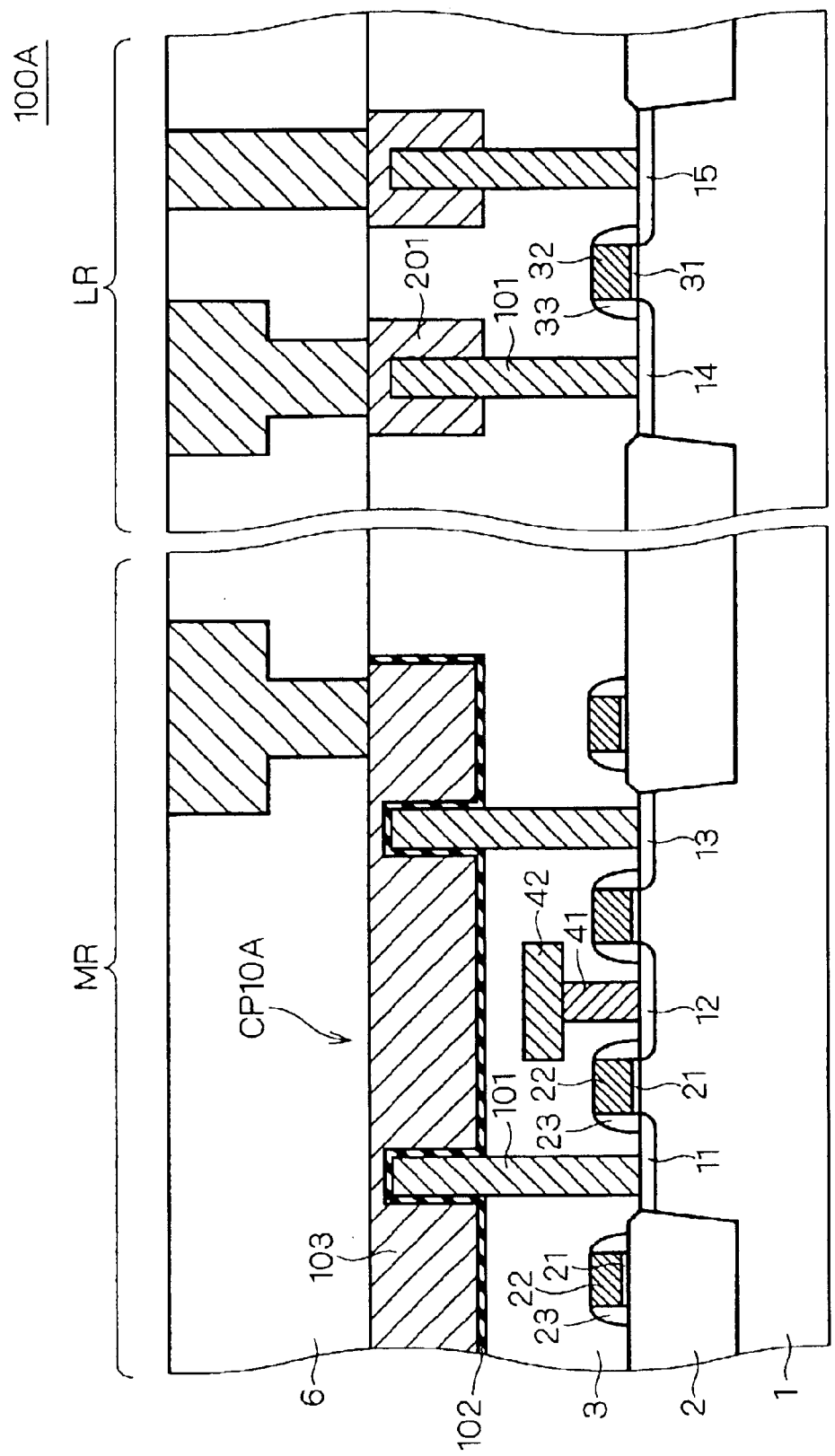
FIG. 16 is a sectional view illustrating a structure according to a variant of the semiconductor device in accordance with the first embodiment of the present invention.

In a capacitor CP10A shown in FIG. 16, a contact plug 101 in a memory cell region MR does not penetrate through a capacitor upper electrode 103 but has an inserted portion surrounded by the capacitor upper electrode 103, and a capacitor dielectric film 102 is also provided on an end surface of the contact plug 101 so that a surface area of a capacitor lower electrode is increased. Consequently, a stored charge amount of the capacitor can be made larger than that of the DRAM 100. The contact plug 101 in a peripheral circuit region LR does not penetrate through a wiring layer 201.

Figure 17:
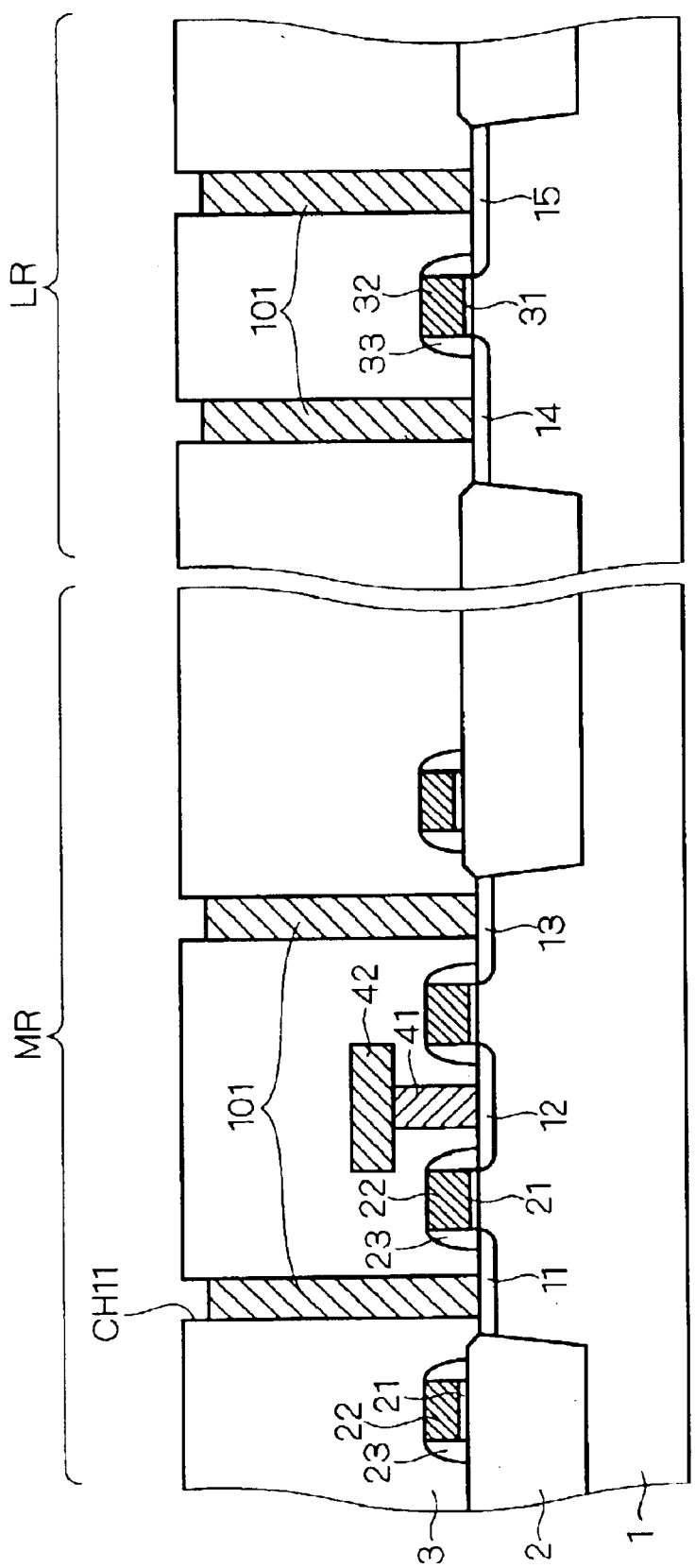
FIG. 17 is a sectional view illustrating a manufacturing process according to the variant of the semiconductor device in accordance with the first embodiment of the present invention.

A method of manufacturing the DRAM 100A will be described with reference to FIG. 17. Steps to be carried out until FIG. 17 are the same as the steps of manufacturing the DRAM 100 described with reference to FIGS. 2 to 9. At the step shown in FIG. 9, the contact plug 101 is formed in the contact hole CH11. Then, the contact plug 101 in the contact hole CH11 is removed by anisotropic etching such that a tip portion thereof reaches a predetermined depth at the step shown in FIG. 17. Consequently, it is possible to obtain the contact plug 101 having a tip portion provided on an inner part in the contact hole CH11. The depth is set such that the capacitor dielectric film 102 is not exposed from the capacitor upper electrode 103 when the capacitor dielectric film 102 is formed on an upper end surface of the contact plug 101 and is covered with the capacitor upper electrode 103 in this state.

By carrying out the manufacturing steps described with reference to FIGS. 10 to 14, subsequently, it is possible to obtain the DRAM 100A having the capacitor CP10A shown in FIG. 16.

A-5. Applied Example

While the structure of the capacitor in the memory cell region MR of the DRAM is simplified in the first embodiment described with reference to FIGS. 1 to 15 and the variant described with reference to FIG. 16, the application of the capacitor is not restricted to the memory cell region but the same capacitor may be applied to any part in a circuit region requiring the capacitor, for example, a logic region, and furthermore, a semiconductor device to be applied is not restricted to the DRAM.

Figure 18:
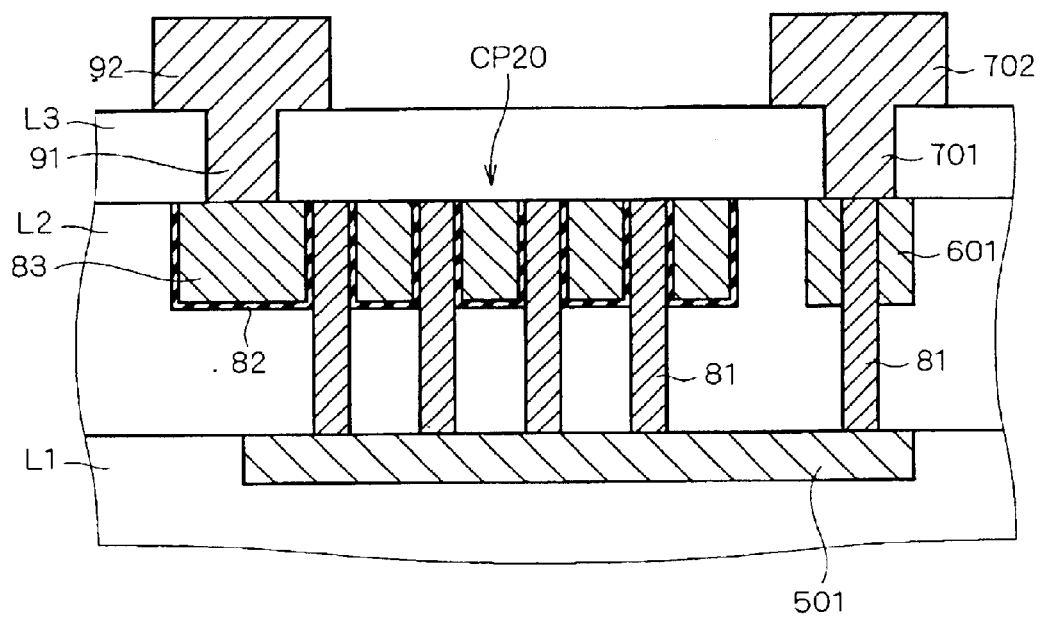
FIGS. 18 and 19 are sectional views illustrating an applied example of the semiconductor device according to the first embodiment of the present invention.

FIG. 18 shows an example in which the capacitor according to the present invention is applied to a region other than the memory cell region.

In FIG. 18, in a structure in which interlayer insulating films L1, L2 and L3 are sequentially provided, a wiring layer 501 constituted by tungsten (W), for example, is provided in an upper main surface of the interlayer insulating film L1, a capacitor CP20 is provided in an upper main surface of an interlayer insulating film L2, and the capacitor CP20 and the wiring layer 501 are electrically connected to each other through a plurality of contact plugs 81 penetrating through the capacitor CP20 in a vertical direction and penetrating through the interlayer insulating film L2 to reach the wiring layer 501.

The capacitor CP20 basically has the same structure as that of the capacitor CP10 described with reference to FIG. 1, and has a capacitor upper electrode 83 provided to be embedded in an upper main surface of an interlayer insulating film 3 and a capacitor dielectric film 82 provided to cover a side surface and a lower surface of the capacitor upper electrode 83 and constituted by $Ta_2O_5$, for example, and the capacitor dielectric film 82 covers a side surface of the contact plug 81 penetrating through the capacitor upper electrode 83 in the vertical direction and the same portion functions as the capacitor lower electrode 81. The contact plug 81 is constituted by tungsten, for example.

Moreover, a wiring layer 601 is also provided selectively in an upper main surface of the interlayer insulating film 3. The wiring layer 601 is electrically connected by the contact plug 81 penetrating through the wiring layer 601 in the vertical direction and penetrating through the interlayer insulating film 3 to reach the wiring layer 501.

Thereafter, wiring layers 92 and 702 are selectively provided on the interlayer insulating film L3 and are electrically connected to the capacitor upper electrode 83 and the wiring layer 601 through the interlayer insulating film L3, respectively. The capacitor upper electrode 83, the wiring layers 92, 601 and 702, and the contact plugs 91 and 701 are constituted by copper (Cu), for example.

An electric charge can be stored in or discharged from the capacitor CP20 through the wiring layer 702, the contact plug 701, the wiring layer 601, the contact plug 81 and the wiring layer 501.

An interlayer insulating film and a wiring layer are further formed on the interlayer insulating film L3 in some cases, and their illustration and description will be omitted.

The capacitor CP20 has a plurality of contact plugs 81 (that is, capacitor lower electrodes) in addition to the same effects as those of the capacitor CP10, and therefore has a feature that a total surface area of the capacitor lower electrode is increased, resulting in an increase in a stored charge amount.

In the same manner as the capacitor CP10A described with reference to FIG. 16, moreover, it is also possible to employ such a structure that the contact plug 81 does not penetrate through the capacitor upper electrode 83 and an inserted portion is surrounded by the capacitor upper electrode 83, and the capacitor dielectric film 82 is also provided on an end surface of the contact plug 81, resulting in a more increase in the surface area of the capacitor lower electrode.

Figure 19:
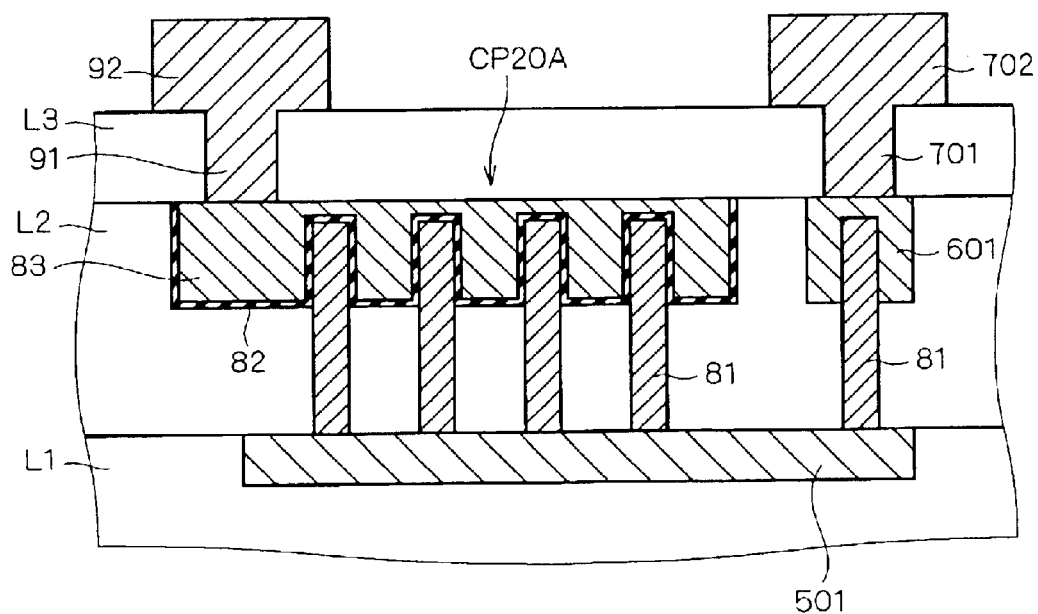

FIG. 19 shows a structure of the capacitor CP20A having the structure described above. The capacitor CP20A is different from the capacitor CP20 shown in FIG. 18 in that the contact plug 81 does not penetrate through the capacitor upper electrode 83. The same structures as those of the capacitor CP20 shown in FIG. 18 have the same reference numerals and repetitive description will be omitted. The contact plug 81 does not penetrate through the wiring layer 601.

B. Second Embodiment

B-1. Structure of Device

For a semiconductor device according to a second embodiment of the present invention, a structure of a DRAM 200 will be described with reference to FIG. 20.

FIG. 20 is a partial sectional view showing a memory cell region MR and a peripheral circuit region LR such as a logic circuit, a sense amplifier or a decoder which is provided around the memory cell region MR in the DRAM 200. The same structures as those of the DRAM 100 shown in FIG. 1 have the same reference numerals and repetitive description will be omitted.

In an active region AR of the memory cell region MR, source—drain regions 11, 12 and 13 are selectively provided in a surface of a substrate and a gate insulating film 21 is selectively provided between upper parts of edges of the source—drain regions 11 and 12 and between upper parts of edges of the source—drain regions 12 and 13 respectively, and a gate electrode 22 is provided on the gate insulating film 21. Then, a silicon nitride film 24 is provided on the gate electrode 22 and a side wall nitride film 25 is provided to cover a side surface of each of the gate electrode 22 and the silicon nitride film 24 so that an MOS transistor is constituted.

Moreover, the gate insulating film 21, the gate electrode 22, the silicon nitride film 24 and the side wall nitride film 25 are also provided on an element isolating film 2 and function as a word line (a transfer gate).

In the active region AR of the peripheral circuit region LR, furthermore, source—drain regions 14 and 15 are selectively provided in the surface of the substrate and a gate insulating film 31 is provided between upper parts of edges of the source—drain regions 14 and 15. A gate electrode 32 is provided on the gate insulating film 31, a silicon nitride film 34 is provided on the gate electrode 32, and a side wall nitride film 35 is provided to cover respective side surfaces of the gate electrode 32 and the silicon nitride film 34 so that an MOS transistor is constituted.

A stopper film for forming a self-alignment contact (hereinafter referred to as a stopper film) 9 is provided over the whole surfaces of the memory cell region MR and the peripheral circuit region LR. The stopper film 9 is constituted by a silicon nitride film.

Then, an interlayer insulating film 3 such as a silicon oxide film is provided to cover the memory cell region MR and the peripheral circuit region LR, a capacitor CP30 is provided in an upper main surface of the interlayer insulating film 3 in the memory cell region MR, and any electrical connection of the capacitor CP30 and the source—drain regions 11 and 13 is carried out by a contact plug 101A inserted in the capacitor CP30 and reaching the source—drain regions 11 and 13. The contact plug 101A is inserted to penetrate through a capacitor upper electrode 103A in a vertical direction.

The capacitor CP30 has the capacitor upper electrode 103A provided to be embedded in the upper main surface of the interlayer insulating film 3 and constituted by copper, for example, and a capacitor dielectric film 102A provided to cover a side surface and a lower surface of the capacitor upper electrode 103A.

Moreover, the capacitor dielectric film 102A is also provided to cover a side surface of the contact plug 101A formed to penetrate through the capacitor upper electrode 103A in a vertical direction thereof, and a portion of the contact plug 101A which is covered with the capacitor dielectric film 102A functions as a capacitor lower electrode 10A. Accordingly, it is apparent that the contact plug 101A is a lower electrode-and-plug serving as the capacitor lower electrode. The contact plug 101A is constituted by tungsten (W), for example.

The contact plug 101A takes the shape of a rectangular parallelepiped to have a rectangular sectional shape on a parallel surface with a main surface of a silicon substrate 1 (or the interlayer insulating film 3) and is provided such that a longitudinal direction of the rectangular section is coincident with a direction of a gate length of the MOS transistor, and is electrically connected to the source—drain regions 11 and 13, and furthermore, is engaged with an upper part of a gate structure.

In the peripheral circuit region LR, moreover, a wiring layer 201 to be a first wiring layer is selectively provided in the upper main surface of the interlayer insulating film 3. The wiring layer 201 is provided in each of regions corresponding to portions formed above the source—drain regions 14 and 15, and the source—drain regions 14 and 15 are electrically connected through a contact plug 101 penetrating through the wiring layer 201 in a vertical direction and penetrating through the interlayer insulating film 3 to reach the source—drain regions 14 and 15.

Then, an interlayer insulating film 6 is provided on the interlayer insulating film 3, and a wiring layer 302 to be a second wiring layer is selectively provided in an upper main surface of the interlayer insulating film 6 in the memory cell region MR and is electrically connected to the capacitor upper electrode 103A through a contact plug 301.

While the contact plug 101A takes the shape of the rectangular parallelepiped in the above description, it is premised that the capacitor CP30 is used as a capacitor for a memory. If the capacitor CP30 is used in a region other than the memory cell region, the shape of the contact plug 101A is not restricted to the rectangular parallelepiped but may be a cube or a cylinder.

B-2. Manufacturing Method

A method of manufacturing the DRAM 200 will be described below with reference to FIGS. 21 to 30 which are sectional views sequentially showing a manufacturing process.

FIGS. 21 to 30 are partial sectional views showing a memory cell region MR and a peripheral circuit region LR such as a logic circuit, a sense amplifier or a decoder which is provided around the memory cell region MR in the DRAM 200.

Figure 21:
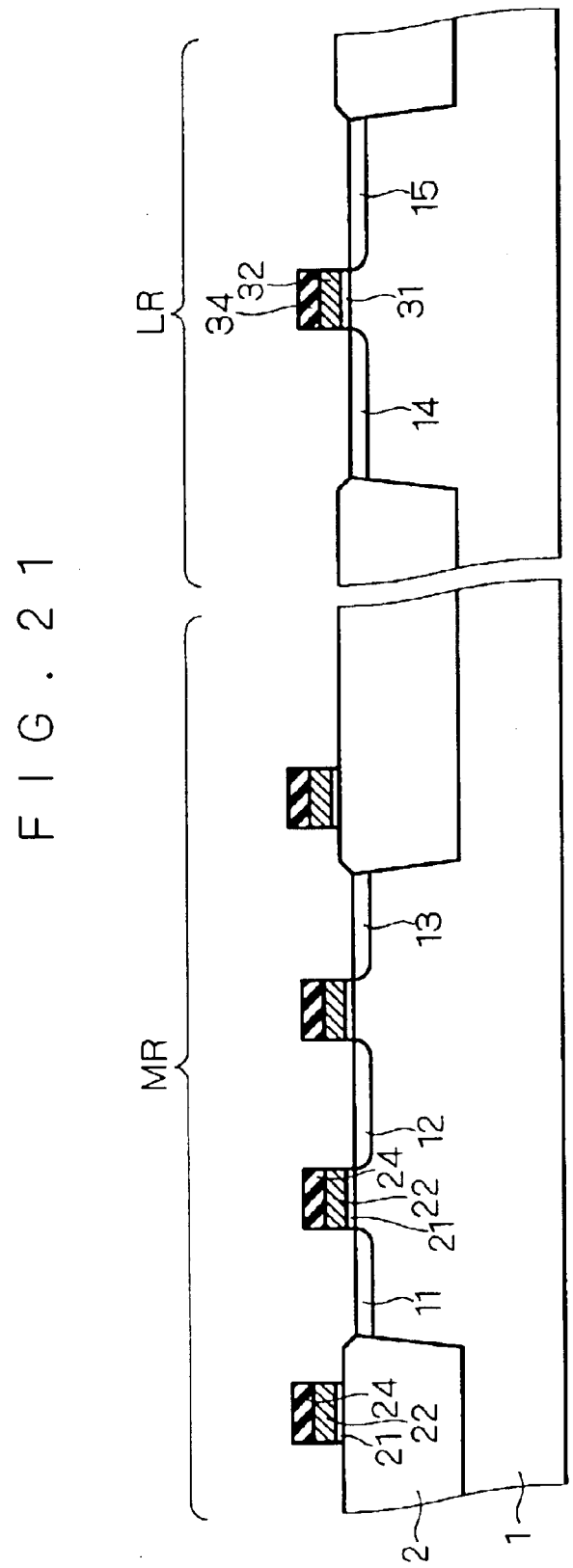
FIGS. 21 to 30 are sectional views illustrating a process for manufacturing the semiconductor device according to the second embodiment of the present invention.

First of all, at a step shown in FIG. 21, an element isolating film 2 is selectively formed in a main surface of a silicon substrate 1 to define a memory cell region MR and a peripheral circuit region LR and to define an active region AR in each of the memory cell region MR and the peripheral circuit region LR. By a conventional method, then, a lamination structure of a gate insulating film 21, a gate electrode 22 and a silicon nitride film 24 is selectively formed in the active region AR of the memory cell region MR and a lamination structure of a gate insulating film 31, a gate electrode 32 and a silicon nitride film 34 is selectively formed in the peripheral circuit region LR. The gate insulating films 21 and 31 are constituted by a silicon oxide film and have thicknesses set to be approximately 2 nm, for example, the gate electrodes 22 and 32 are constituted by a polysilicon film and have thicknesses set to be approximately 100 nm, and the silicon nitride films 24 and 34 are formed by a low pressure CVD method and have thicknesses set to be approximately 100 nm, for example.

In the memory cell region MR, the lamination structure of the gate insulating film 21, the gate electrode 22 and the silicon nitride film 24 is also formed on the element isolating film 2.

Figure 22:
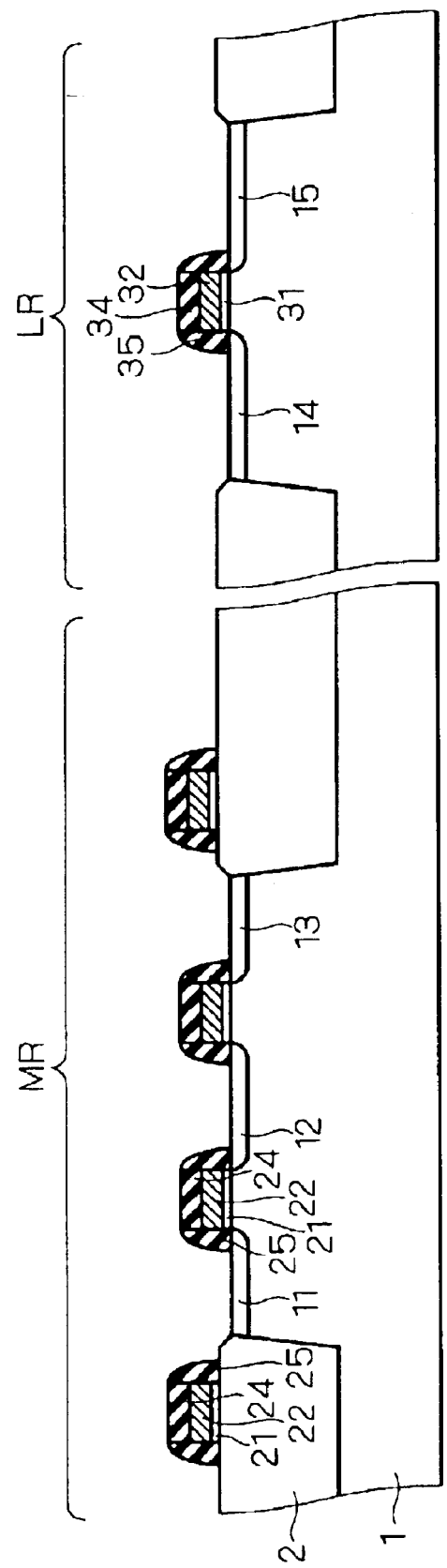

At a step shown in FIG. 22, next, an impurity ion is implanted by using the silicon nitride film 24 and the gate electrode 22 as implantation masks in the memory cell region MR so that source—drain regions 11, 12 and 13 are formed in the main surface of the silicon substrate 1. In the peripheral circuit region LR, moreover, an impurity ion is implanted by using the silicon nitride film 34 and the gate electrode 32 as implantation masks so that source—drain regions 14 and 15 are formed in the main surface of the silicon substrate 1.

Then, a side wall nitride film 25 is formed to cover side surfaces of the silicon nitride film 24 and the gate electrode 22, and furthermore, a side wall nitride film 35 is formed to cover side surfaces of the silicon nitride film 34 and the gate electrode 32 so that an MOS transistor is obtained. The side wall nitride film 35 is formed by the low pressure CVD method and a thickness thereof is set to be approximately 100 nm, for example.

Figure 23:
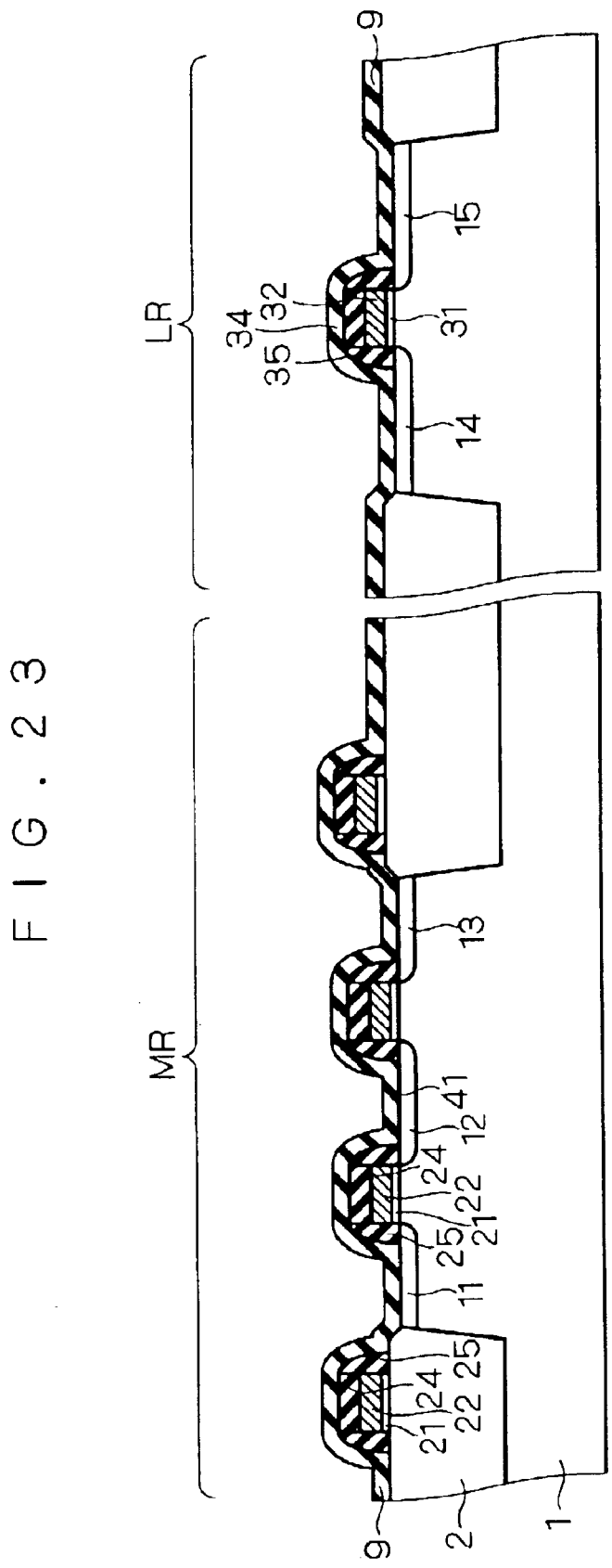

At a step shown in FIG. 23, next, a stopper film 9 is formed over a whole surface of the silicon substrate 1, and a gate structure of each MOS transistor is covered with the stopper film 9. The stopper film 9 is formed by the low pressure CVD method and a thickness thereof is set to be approximately 50 nm, for example.

Figure 24:
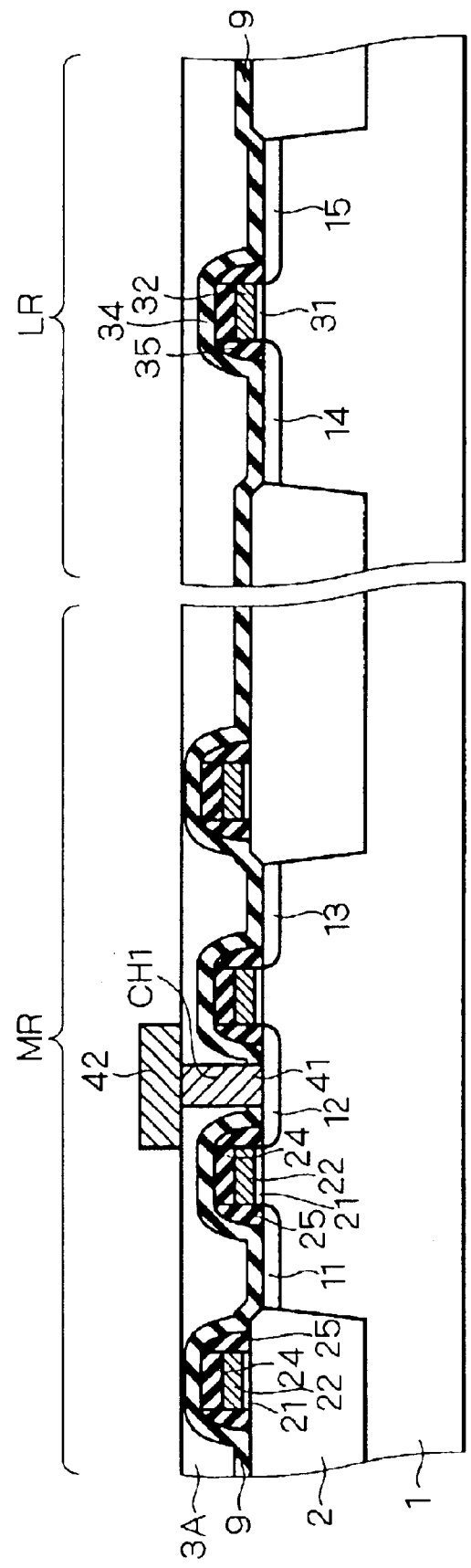

At a step shown in FIG. 24, next, an interlayer insulating film 3A constituted by a silicon oxide film and having a thickness of approximately 400 nm is formed over the whole surface of the silicon substrate 1, thereby covering the MOS transistor, for example. In the memory cell region MR, then, a contact hole CH1 penetrating through the interlayer insulating film 3A to reach the source—drain region 12 is formed, and a conductor film constituted by tungsten and having a thickness of approximately 100 nm, for example, is thereafter formed on the interlayer insulating film 3A and the contact hole CH1 is filled up to form a contact plug 41. Subsequently, the conductor film is selectively removed, thereby forming a bit line 42.

Figure 25:
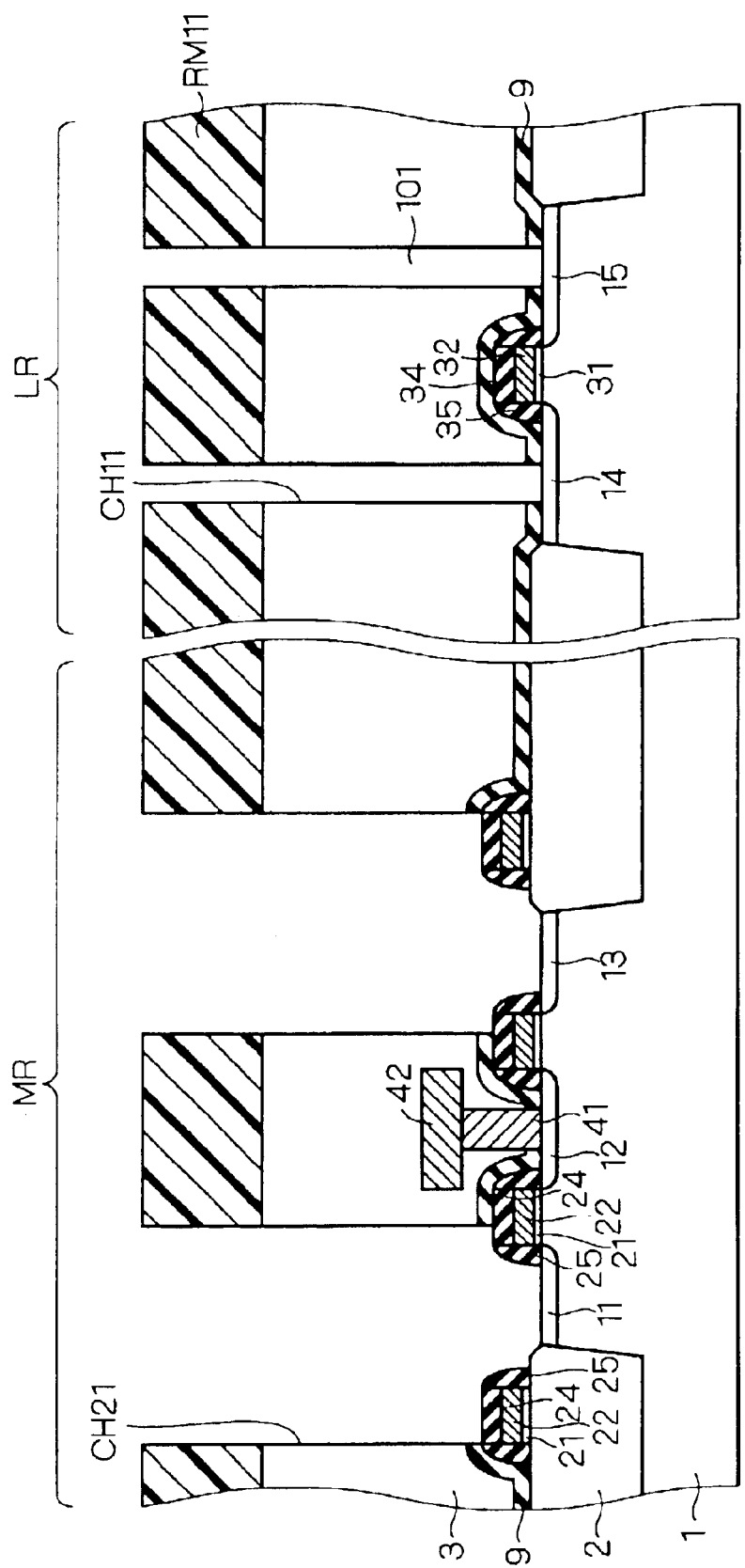

At a step shown in FIG. 25, next, an interlayer insulating film constituted by a silicon oxide film and having a thickness of approximately 600 nm, for example, is formed on the interlayer insulating film 3A so that an interlayer insulating film 3 having a thickness of approximately 1000 nm together with the interlayer insulating film 3A is obtained.

Then, a resist is applied to a whole surface of the interlayer insulating film 3 and a resist pattern for forming a contact plug is transferred to form a resist mask RM11 in the memory cell region MR and the peripheral circuit region LR by photolithography.

By using the resist mask RM11, thereafter, anisotropic dry etching is carried out to form contact holes CH21 and CH11 penetrating through the interlayer insulating film 3 in the memory cell region MR and the peripheral circuit region LR. By setting a condition that an etching rate of the silicon oxide film is increased for the silicon nitride film in the etching, for example, a condition that the etching rate of the silicon oxide film is set to be five times as high as that of the silicon nitride film in etching using a gas such as $C_4F_8$, it is possible to prevent the etching from reaching the silicon substrate 1 and the gate structure.

The contact hole CH21 is formed such that a portion from the source—drain regions 11 and 13 to an upper part of the gate structure is also an opening, an opening shape is, rectangular and a longitudinal direction thereof is coincident with a direction of a gate length of the MOS transistor. The contact hole CH11 in the peripheral circuit region LR is provided in positions reaching the source—drain regions 14 and 15.

Figure 26:
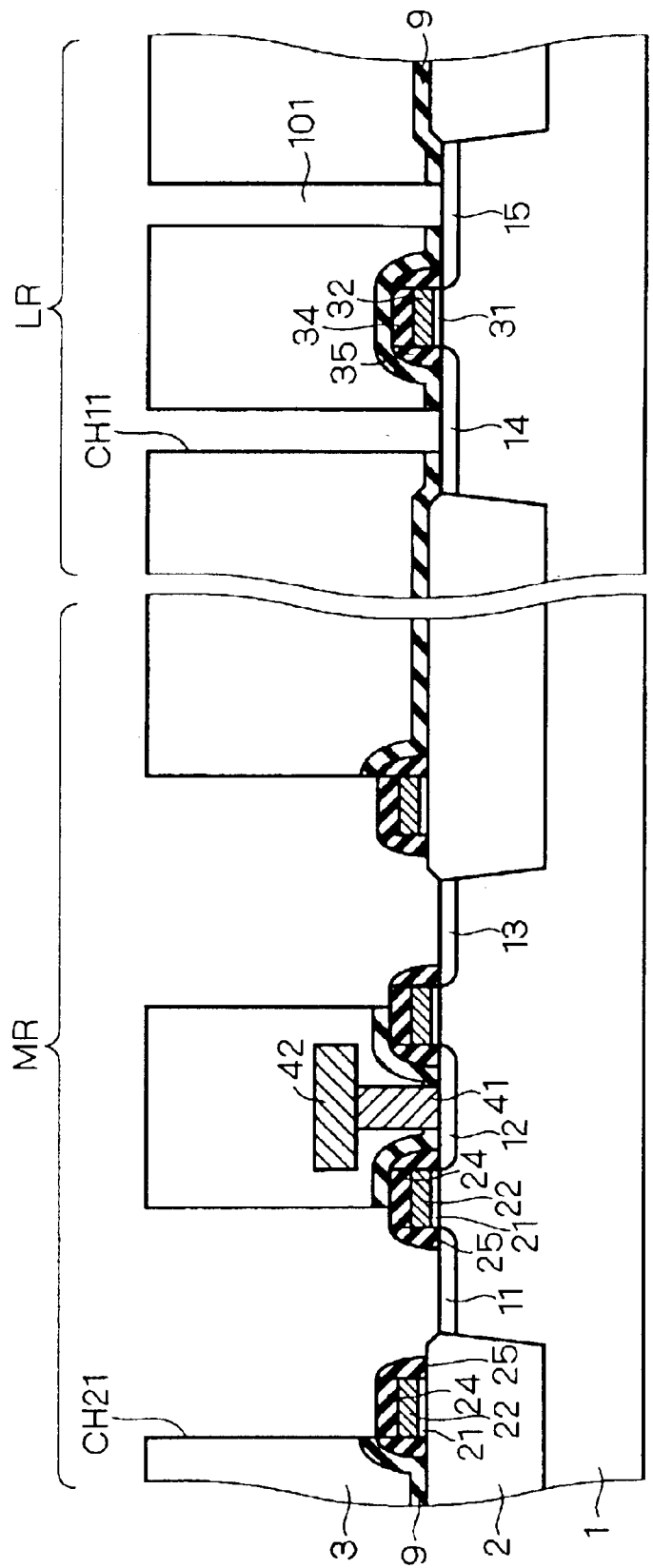

After the resist mask RM11 is removed, next, the stopper film 9 provided on the source—drain regions 11 and 13 and the source—drain regions 14 and 15 is removed by using the interlayer insulating film 3 as an etching mask at a step shown in FIG. 26. At this time, the stopper film 9 on the gate structure which is not covered with the interlayer insulating film 3 is also removed in the memory cell region MR.

Figure 27:
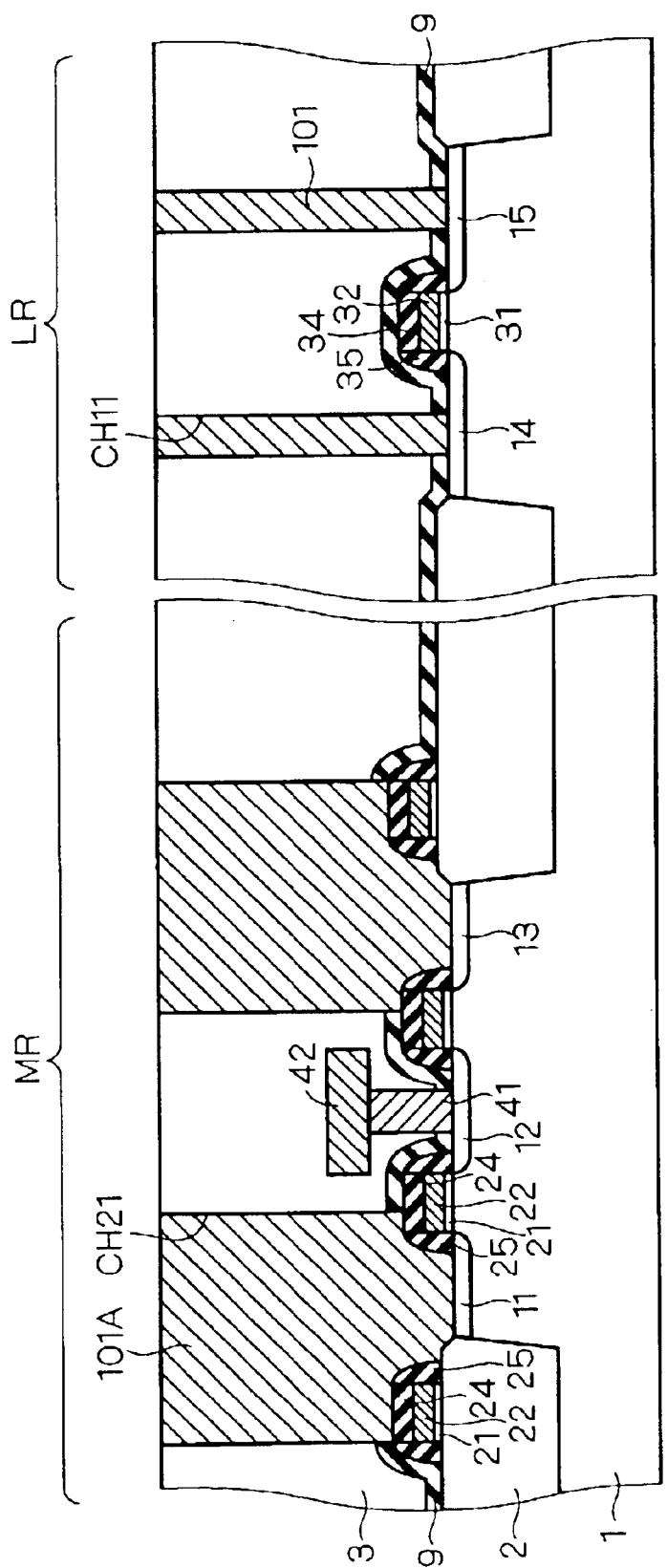

At a step shown in FIG. 27, next, a conductor film constituted by tungsten and having a thickness of approximately 200 nm, for example, is formed over the whole surface of the interlayer insulating film 3 and is embedded in the contact holes CH21 and CH11. Then, the conductor film provided on the interlayer insulating film 3 is removed by CMP and a contact plug 101A is formed in the contact hole CH21 and a contact plug 101 is formed in the contact hole CH11.

An area of a portion in which the contact plug 101A comes in contact with the source—drain regions 11 and 13 is determined in self-alignment at an arrangement interval of the gate structure. Therefore, the contact plug 101A will be referred to as a self-alignment contact.

Figure 28:
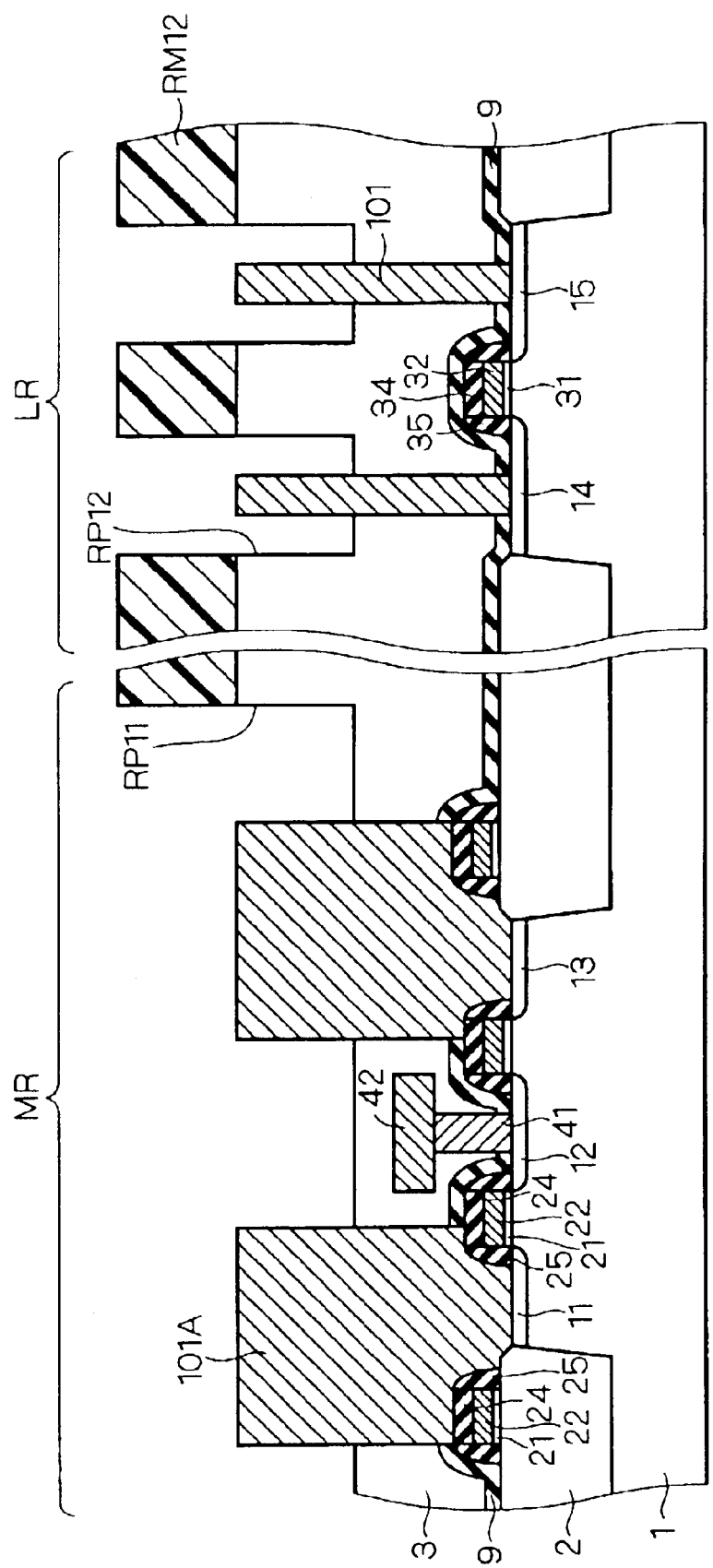
Figure 29:
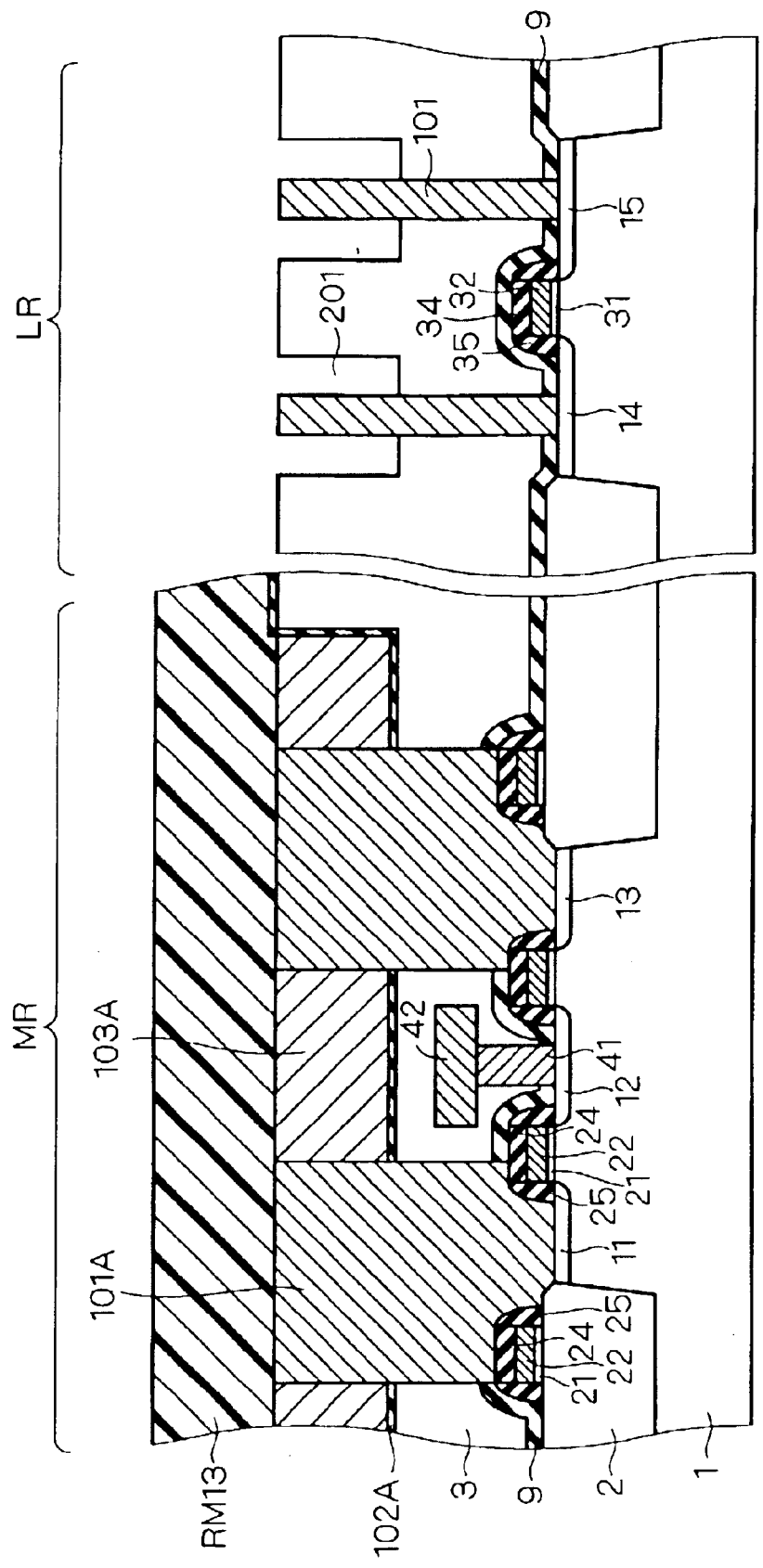

At a step shown in FIG. 28, subsequently, a resist is applied to the whole surface of the interlayer insulating film 3 and a resist pattern for forming a capacitor and a first wiring layer is transferred by the photolithography, thereby forming a resist mask RM12.

In the resist pattern for forming a capacitor, a wide region including a plurality of memory cells in which a capacitor upper electrode 103A is to be formed later is an opening. In the resist pattern for forming a first wiring layer, a region in which the first wiring layer is to be formed later is an opening.

Next, the anisotropic dry etching is carried out by using the resist mask RM12 to selectively remove the interlayer insulating film 3. Consequently, a recess section RP11 for forming a capacitor and a recess section RP12 for forming a first wiring layer are provided in the memory cell region MR and the peripheral circuit region LR at the same time, respectively. The recess sections RP11 and RP12 have depths of approximately 250 nm, and the contact plug 101A is protruded from respective bottom portions.

Then, the resist mask RM12 is removed. At a step shown in FIG. 29, thereafter, a dielectric film constituted by $Ta_2O_5$ and having a thickness of approximately 10 nm, for example, is formed over the whole surfaces of the memory cell region MR and the peripheral circuit region LR. In the memory cell region MR, subsequently, a resist mask RM13 is patterned to cover the dielectric film. Then, the dielectric film in the peripheral circuit region LR is removed by etching, thereby forming a capacitor dielectric film 102A in only the memory cell region MR. The capacitor dielectric film 102A is formed along an internal surface of the recess section RP11, and furthermore, is provided to cover a side surface and an end surface of the contact plug 101A which are protruded from a bottom surface of the recess section RP11.

Next, the resist mask RM13 is removed. At a step shown FIG. 30, then, a conductor film constituted by copper and having a thickness of approximately 300 nm, for example, is formed over the whole surfaces of the memory cell region MR and the peripheral circuit region LR, and the conductor film is embedded in the recess sections RP11 and RP12.

Then, flattening is carried out by removing the conductor film formed on the interlayer insulating film 3 and the conductor film rising onto the recess sections RP11 and RP12 by the CMP. In this case, in the memory cell region MR, the capacitor dielectric film 102A provided on the end surface of the contact plug 101A is removed together with the capacitor dielectric film 102A provided on the interlayer insulating film 3.

As a result, the capacitor CP30 is obtained by the capacitor upper electrode 103A and the capacitor dielectric film 102A which are embedded in the upper main surface of the interlayer insulating film 3 and the contact plug 101A provided to penetrate through the capacitor upper electrode 103A in a vertical direction thereof and serving as the capacitor lower electrode in the memory cell region MR, and the wiring layer 201 embedded in the upper main surface of the interlayer insulating film 3 is obtained in the peripheral circuit region LR.

Subsequently, the DRAM 200 shown in FIG. 20 is obtained through a method of manufacturing a second wiring layer using the Dual Damascene method described with reference to FIGS. 13 and 14.

Figure 31:
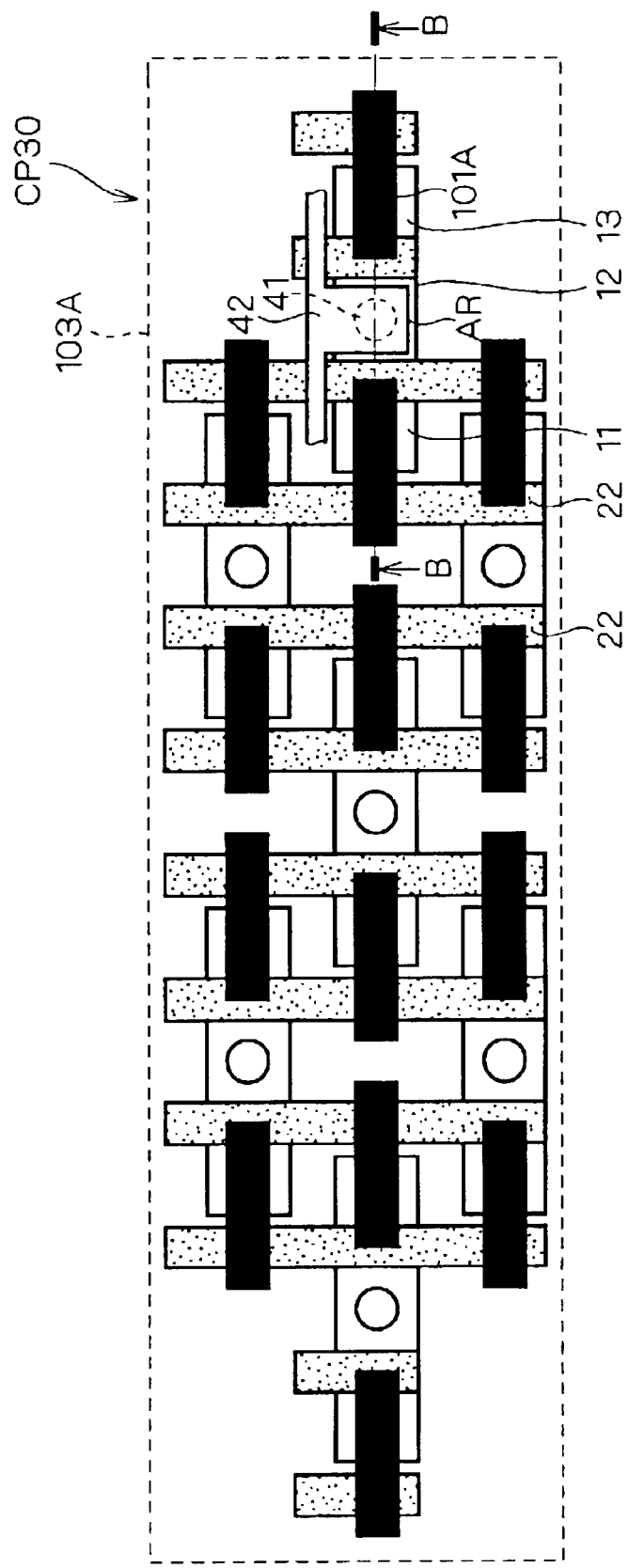
FIG. 31 is a view illustrating a planar structure of the semiconductor device according to the second embodiment of the present invention.
Figure 32:
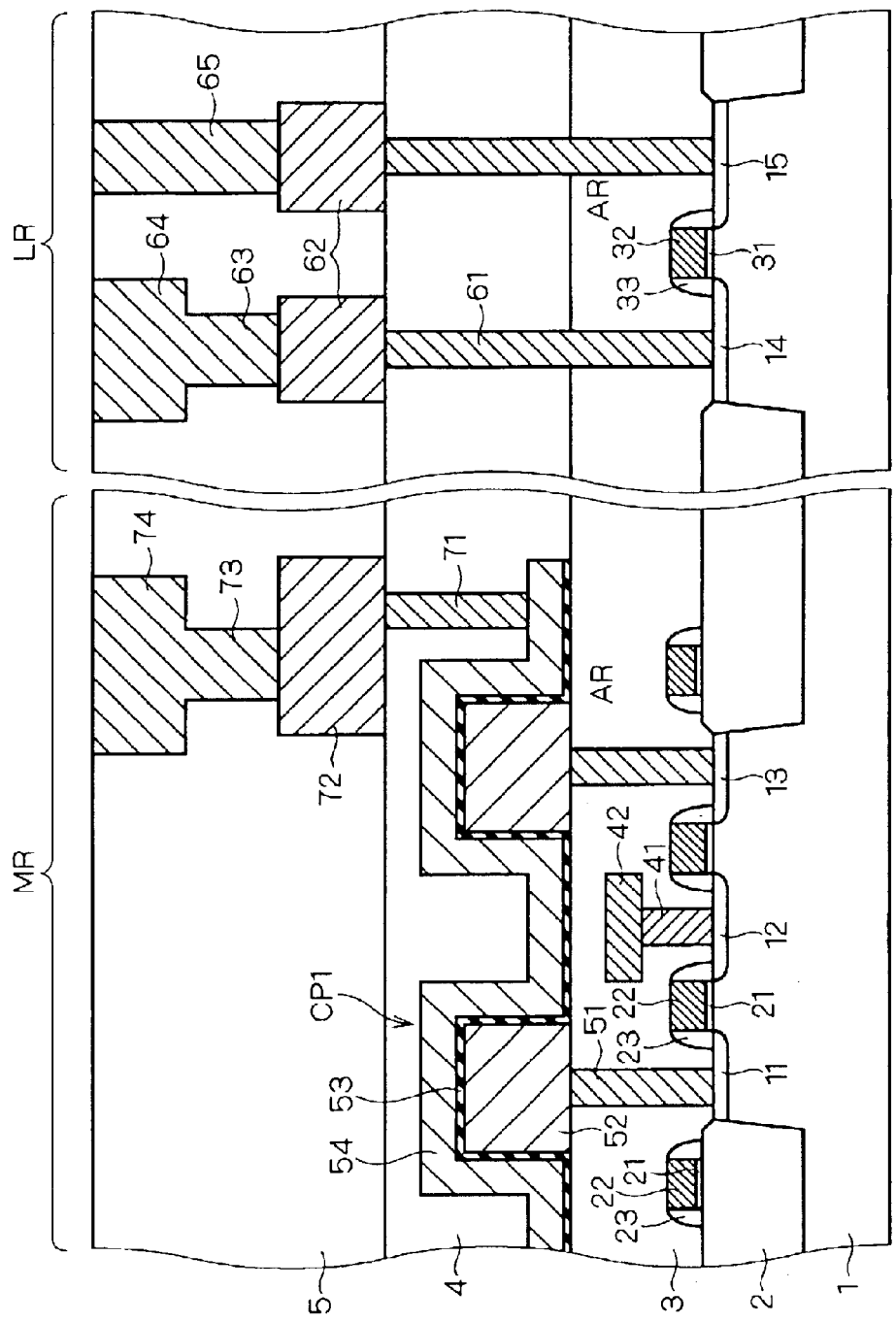
FIG. 32 is a sectional view illustrating a structure of a conventional semiconductor device.

FIG. 31 shows an example of a planar structure of the memory cell region MR in the DRAM 200.

Figure 30:
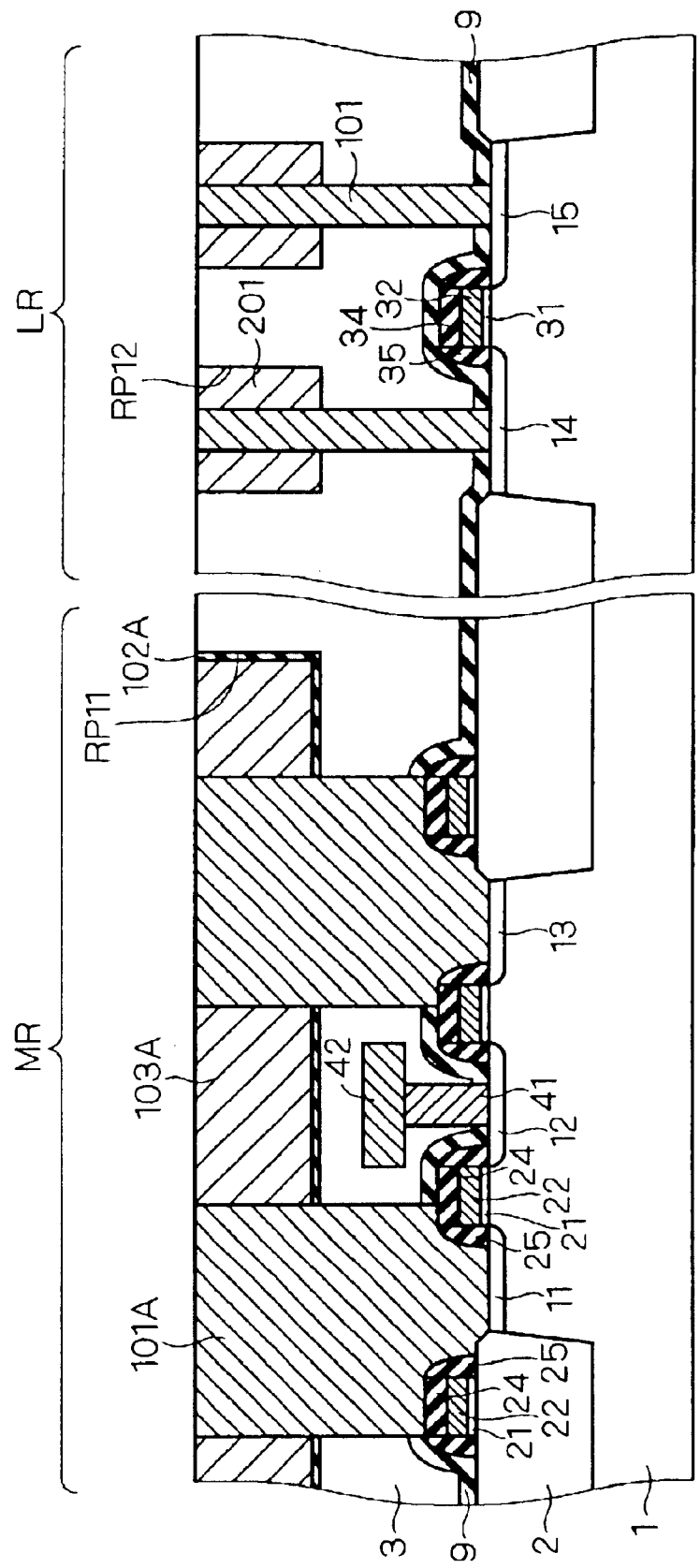

FIG. 31 shows a planar structure of the memory cell region MR seen from the capacitor upper electrode 103A side in the state illustrated in FIG. 30. For convenience, the capacitor upper electrode 103A is shown in a broken line and a structure of a layer provided under the capacitor upper electrode 103A is illustrated clearly. Moreover, only a part of the bit line 42 is shown. The memory cell region MR in FIGS. 21 to 30 corresponds to a sectional view taken along a B—B line. It is apparent that the capacitor upper electrode 103A is provided to cover a wide region including a plurality of memory cells.

FIG. 30 shows a structure in which one contact plug 101A is connected to each of the source—drain regions 11 and 12. In the case in which the source—drain regions 11 and 12 have large areas and a plurality of contact plugs 101A can be connected, the contact plugs 101A may be provided. Consequently, it is possible to increase an electric charge storage capacitance per memory cell.

B-3. Function and Effect

As described above, in the semiconductor device according to the second embodiment of the present invention, the lower electrode of the capacitor CP30 is also used as the contact plug 101A to be a capacitor contact, and the lower electrode and the capacitor contact can be simultaneously formed in the memory cell region MR and the contact plug 101A to be a contact of the first wiring layer in the peripheral circuit region LR and a semiconductor element is also formed simultaneously. Consequently, the manufacturing process can be simplified so that a manufacturing cost can be reduced.

Moreover, the capacitor CP30 is embedded in the upper main surface of the interlayer insulating film 3, and the capacitor upper electrode 103A is also used as the first wiring layer in the memory cell region MR and can be provided by the Single Damascene method simultaneously with the formation of the first wiring layer in the peripheral circuit region LR. Consequently, the manufacturing process can be simplified so that the manufacturing cost can be reduced.

Furthermore, since the contact plug 101A which also serves as a capacitor lower electrode takes the shape of a rectangular parallelepiped and employs the self-alignment contact structure, a surface area thereof can be very enlarged and a stored charge amount can be increased.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having a multilayer structure, comprising:

a capacitor provided in an upper main surface of a first region of an interlayer insulating film; and a wiring layer provided in an upper main surface of a second region of said interlayer insulating film, wherein said capacitor has a capacitor upper electrode provided to be embedded in said upper main surface of said first region of said interlayer insulating film;

a capacitor dielectric film provided to cover at least a side surface and a lower surface of said capacitor upper electrode; and at least one lower electrode-and-plug electrically connecting said capacitor to a structure of a layer provided under said capacitor and having a portion inserted in a vertical direction of the capacitor upper electrode, said inserted portion functioning as a capacitor lower electrode, and said capacitor dielectric film further covers a surface of said inserted portion of said at least one lower electrode-and-plug, and said wiring layer is electrically connected to a structure of a layer provided under said wiring layer by at least one contact plug having a portion inserted in a vertical direction of said wiring layer.

2. The semiconductor device according to claim 1, wherein said at least one lower electrode-and-plug is provided such that said inserted portion in said capacitor upper electrode penetrates through said capacitor upper electrode, and said capacitor dielectric film is provided to cover a side surface of said inserted portion of said at least one lower electrode-and-plug.

3. The semiconductor device according to claim 1, wherein said at least one lower electrode-and-plug is provided such that said inserted portion in said capacitor upper electrode does not penetrate through said capacitor upper electrode, and said capacitor dielectric film is provided to cover a side surface and an end surface of said inserted portion of said at least one lower electrode-and-plug.

4. The semiconductor device according to claim 1, wherein said at least one lower electrode-and-plug takes a shape of a rectangular parallelepiped having a rectangular sectional shape on a parallel surface with a main surface of said interlayer insulating film.

5. The semiconductor device according to claim 4, wherein said at least one lower electrode-and-plug taking said shape of a rectangular parallelepiped is a plug to be electrically connected to a source—drain region of an MOS transistor provided on a semiconductor substrate, and is provided such that a longitudinal direction of a rectangular section thereof is coincident with a direction of a gate length of said MOS transistor and is also engaged with a gate structure of said MOS transistor in a lower end surface thereof.

6. The semiconductor device according to claim 1, wherein said at least one lower electrode-and-plug includes a plurality of lower electrode-and-plugs, and said lower electrode-and-plugs are electrically connected to said structure of a layer provided under said capacitor in common.

7. The semiconductor device according to claim 1, wherein said at least one contact plug and said at least one lower electrode-and-plug are constituted by the same material, and said wiring layer and said capacitor upper electrode are constituted by the same material.

8. The semiconductor device according to claim 7, wherein said first region of said interlayer insulating film is a memory cell region which stores an electric charge in said capacitor to hold data, and said second region of said interlayer insulating film is a peripheral circuit region to be operated interlockingly with said memory cell region.

* * * * *